(12) United States Patent
Kejriwal

(10) Patent No.: US 7,579,894 B2
(45) Date of Patent: Aug. 25, 2009

(54) DEBOUNCE CIRCUIT AND METHOD

(75) Inventor: Abhay Kejriwal, Edinburgh (GB)

(73) Assignee: Wolfson Microelectronics plc, Edinburgh (GB)

(*) Notice: Subject to any disclaimer, the term of this patent is extended or adjusted under 35 U.S.C. 154(b) by 399 days.

(21) Appl. No.: 11/783,579

(22) Filed: Apr. 10, 2007

(65) Prior Publication Data

US 2007/0236257 A1 Oct. 11, 2007

(30) Foreign Application Priority Data

Apr. 11, 2006 (GB) ................... 0607306.8

(51) Int. Cl.
*H03K 17/16* (2006.01)
(52) U.S. Cl. ........................................ 327/386; 327/34
(58) Field of Classification Search .................. 327/34, 327/385, 386
See application file for complete search history.

(56) References Cited

U.S. PATENT DOCUMENTS

| 4,523,104 | A | | 6/1985 | Norris et al. |
| 5,001,374 | A | * | 3/1991 | Chang ..................... 327/552 |
| 6,337,649 | B1 | * | 1/2002 | Becker et al. ............. 341/155 |
| 6,414,540 | B2 | * | 7/2002 | Drexler .................... 327/552 |
| 6,566,939 | B1 | | 5/2003 | Berka et al. |
| 2001/0004731 | A1 | | 6/2001 | Drexler |

FOREIGN PATENT DOCUMENTS

EP 0 514 714 11/1992

* cited by examiner

*Primary Examiner*—Lincoln Donovan
*Assistant Examiner*—William Hernandez
(74) *Attorney, Agent, or Firm*—Dickstein Shapiro LLP

(57) ABSTRACT

A circuit for debouncing a signal from a switch or other input. The invention provides an arrangement which receives an input signal and which monitors the input to provide an output which switches after a predetermined time from the input signal changing from one state to another. However, the output changes back to its original state in a much shorter time if said input changes back to its original state.

59 Claims, 12 Drawing Sheets

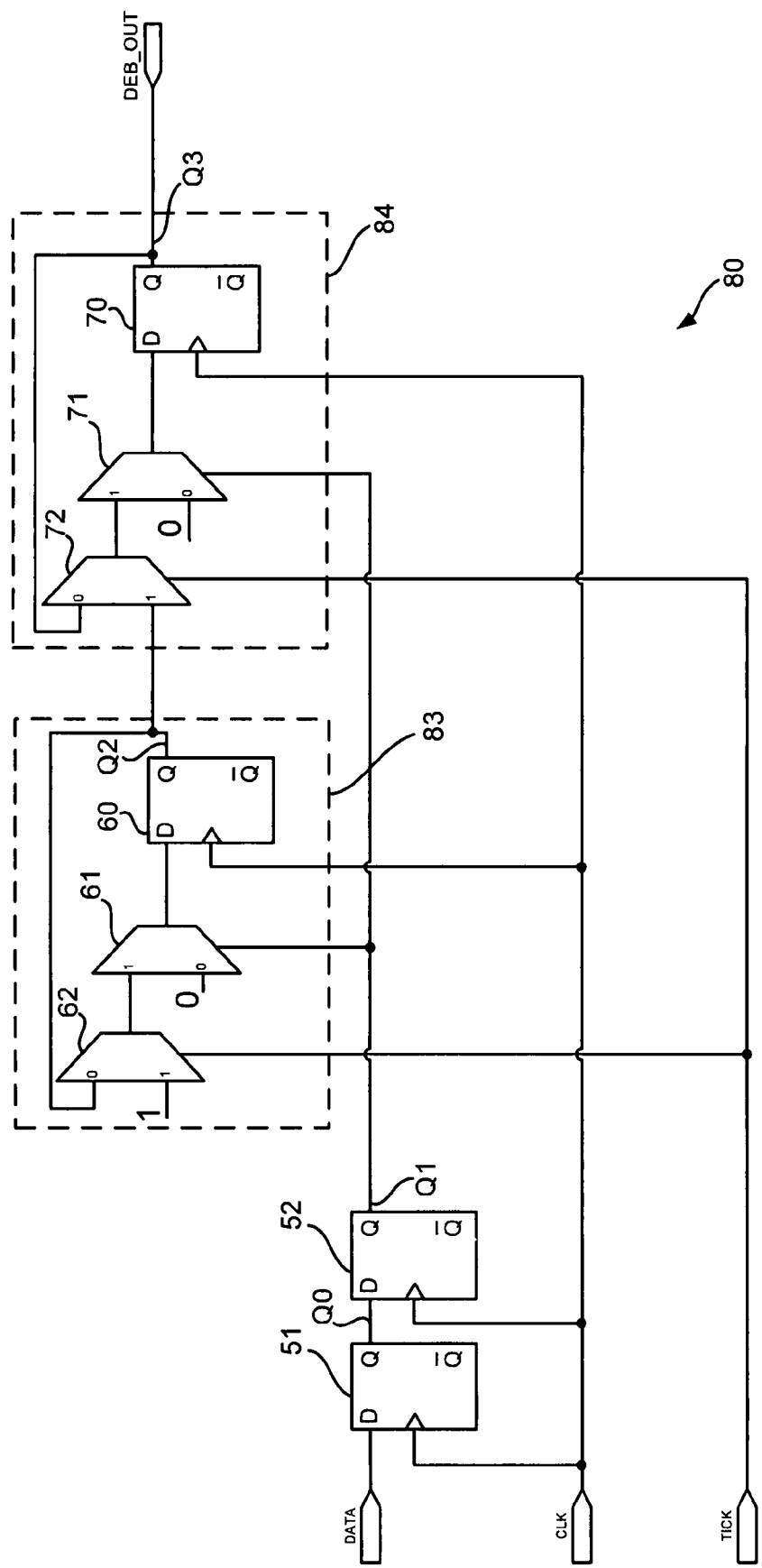

DEBOUNCE CIRCUIT AND METHOD

BACKGROUND OF THE INVENTION

1. Field of the Invention

The present invention relates to debouncing an input signal such as from a switch, particularly a mechanical switch, or some other monitored signal, which may suffer transient voltage variations.

2. Description of the Related Art

When a mechanical switch is opened or closed, a mechanical contact is physically moved from one position to another. This momentum can prevent a clean opening or closing of the switch. In particular, when the switch is closing, the moving contact of a switch may move rapidly towards the other contact. As the two contacts come together, the electrical circuit is completed and the switch is "electrically" closed. However the momentum of the switch may cause the moving contact to deflect off the other contact or "bounce". As the moving contact deflects away from the other contact, the electrical circuit is broken again. The biasing of the switch will eventually bring the moving contact back towards the other contact, again making electrical connection. However, the moving contact may again bounce, again breaking the electrical contact. This may be repeated a number of times until the mechanical energy of the contact has been dissipated and the two contacts remain physically and hence electrically connected, until the switch is activated again.

FIG. 1 shows a simple circuit that may be used to obtain an input from a mechanical switch. The switch 1 is connected to a biasing resistor 2. The biasing resistor holds the output at the supply voltage until the switch closes. As the switch closes, the bouncing of the contact causes the output of the circuit to repeatedly switch between the two supply rails until the bouncing of the switch ceases.

Depending upon how the output of mechanical switches is utilised, the bouncing effect may appear as multiple actuations of the switch. For example, if the switch is a simple push to activate type switch, it may appear as though the user has activated the switch several times when in fact they have simply operated the switch once.

To overcome this problem circuits, known as debounce circuits, have been used to mitigate the effects of switch bounce. These circuits typically involve taking the input from the switch and delaying it for a predetermined period of time. If the switch continues to stay in the same state for the duration of the delay, the circuit provides an output indicating the new state of the switch only after the predetermined amount of time.

For example, U.S. Pat. No. 4,523,104 describes an arrangement which passes the output of a switch into a shift register. The signal is serially shifted through a series of stages of the shift register. The output from each of the stages of the shift register is passed into a NAND gate. In this way, only if the input from the switch remains in the same state for the time it takes for an input to pass through the shift register will the output state change. Any brief transition back to the off state will reset the output. The transient will have to pass entirely through the register before the output can go back to a high output.

Other methods of achieving debounce include using a counter. The counter is started when the switch is closed and the input signal changes state. If the input reverts to its original state due to bounce, the counter is reset. When the input signal changes state again, the counting begins again. Thus the counter only reaches a predefined value after the input has remained in the same state for a sufficient duration, namely the debounce time. Only after this value is reached does the output change state.

FIG. 2 shows a circuit which also provides a debounce function with a synchroniser on the output. A series of D-type flip-flops 20, 21 are used to synchronise the input and to provide the debounce function. A clock labelled SLOW_CLK is used to provide the clock signal to the flip-flops. The input signal (DATA) from the switch is provided to a first flip-flop 20. As the switch is actuated the input DATA goes high. At the next clock transition, the flip-flop 20a output Q0 switches to high. This is in turn fed to the next flip-flop 20b which in turn has its output Q1 switched to high at the next clock transition. The function of the flip-flops 20a, 20b is to synchronise the input signal to the SLOW_CLK signal. Two flip-flops are provided to avoid metastability problems.

Metastability problems occur where the data input changes state at roughly the same time as the clock changes state. This can lead to the output of the flip-flop becoming metastable, i.e. an undefined voltage which is neither of the valid digital logic states. If this output was used directly on the downstream logic elements, this could lead to unpredictable outputs. This can also lead to high currents. Consequently, to avoid metastability problems, a second flip-flop 20b is used. This helps to prevent a metastable output from the first flip-flop from propagating to the downstream logic components.

The probability of a flip-flop becoming metastable is fairly low. However, the problems caused by metastability mean that it is now customary to use multistage flip-flops for synchronization of an asynchronous input to a synchronous system. The drawback of this is that the synchroniser introduces additional delay before the output switches changes state in response to a change of state of the input.

Referring again to FIG. 2, the output Q1 is then passed through the two flip-flops 21a, 21b, each of which delay the input signal by one clock cycle. FIG. 3 shows the typical signals passing through the circuit of FIG. 2. In this example, the flip-flops switch on the positive going cycle of the clock signal SLOW_CLK. The switch is actuated and, at time $t_0$, first makes an electrical contact. At time $t_1$, the first subsequent clock transition takes place and the first flip-flop 20a switches to provide a high output.

At time $t_2$, the bounce of the switch reopens the electrical circuit whereupon the input again falls to a low level. However, as the switch remakes the electrical contact before the next clock transition, this transition is not detected by the flip-flop 20a. Consequently, at the next clock transition, with the input again high, the output Q0 of flip-flop 20a, remains high. Simultaneously, the previously high input to flip-flop 20b means that the output Q1 of flip-flop 20b now also becomes high. At time $t_3$, the switch again bounces open. Even though the switch remains electrically disconnected for almost one clock cycle, because the period does not coincide with a clock transition, it is again undetected by the first flip-flop 20a. Consequently, at the next clock transition, the output Q0 remains high. Output Q1 remains high and output Q2 from flip-flop 21a now becomes high. At the next clock transition, the input is still high and the sequence of high signals passes through the flip-flops such that the output Q3 from flip-flop 21b becomes high.

The outputs Q1, Q2 and Q3 are fed to an AND gate 22 which provides the output from the debounce circuit. As the output Q3 switches to high, all the inputs to the AND gate are now high and the output of the circuit, DEB_OUT, switches to high. The output will remain high until such a time as the input signal DATA is at a low level during a clock transition. At time $t_4$, the input signal DATA switches to low and remains low through the next clock transition. Consequently, the output from flip-flop Q0 switches to low. At the next clock cycle, the low input is fed into input flip-flop 20b and output Q1 goes low. This causes the output of the circuit from AND gate 22 to also switch to low. This low value will then pass through the flip-flops 21a and 21b keeping the output low until the input has been high for at least three (3-4) clock cycles.

The circuit of FIG. 2 can provide a debounce function principally by delaying the time before the output changes state, to ensure that any bouncing of the switch contacts is completed before the circuit output switches. In the example of FIG. 2, the output DEB_OUT does not go high until two clock cycles after the output of the synchroniser Q1 goes high. This represents at least three clock cycles from the closure of the switch. However, it will be apparent that transitions of the input which take place between transitions of the clock may not be detected so unless sufficient debounce time is provided, undetected switch bounce may still be occurring when the output switches to high. If a bounce is then detected, this will result in the output switch switching back to low again. In effect these circuits simply provide a delay of sufficient length after an initial change in the input to reasonably ensure that bouncing has ended. Consequently, these circuits can either be unreliable, if the delay is too short, or alternatively have to be designed to have sufficiently long delays to ensure that any bounce is completed before the output switches state.

The problem of detecting short duration transitions or glitches of the input signal can be reduced by increasing the clock speed. However, to avoid reducing the safety margin, this requires more delay stages, i.e. the flip-flops 21a, 21b, in order to maintain the overall debounce time. For example, it may be required to have a debounce time of 2 seconds. In the circuit shown in FIG. 2 a 1 Hz clock would be required to provide this. This means that glitches of less than 1 second may be undetected by the circuit. If the clock speed was increased to 1 kHz, then only glitches of less than 1 ms would remain undetected. However, it would be necessary to have a much larger shift register or counter. A shift register with 2,000 delay stages or an 11 bit counter would be needed to provide the same 2 s debounce time. This makes the debounce circuitry extremely complex, requiring a large number of components and needing a significant amount of power. These types of debounce circuits are often needed on portable electronic equipment where large size and power usage are unacceptable.

It is therefore desirable to provide a debounce circuit which is capable of providing a sufficiently long debounce period to accommodate the worst case settling time for mechanical switches but which is also able to detect short glitches caused by bouncing of the switch contacts to prevent the output from switching to the on state before bouncing has stopped.

The need for this type of debouncing of an input signal also occurs where signals such as power supply voltage levels are being monitored to make sure they meet predetermined criteria. In the case of the voltage of a power source, it might be desirable to make sure the voltage exceeds a certain level to ensure proper operation of a powered device. If the level drops below the threshold, switching to an alternate source can be carried out to avoid interruption to the operation of the device. During normal operation, the voltage level may drop (or rise) transiently such as due to surges in demand on the supply. Such short transients do not warrant switching to an alternate supply as the supply will normally recover in a short time.

It is therefore desirable to avoid sensitivity to such limited duration transients. This can be provided by a debounce circuit similar to that used for monitoring switches with appropriate adjustment according to the time scales involved. However, similar problems with prior art systems described above also apply. There is therefore a need for a debounce circuit which can overcome or alleviate the problems with the prior art to provide a debounce function for switches or monitored voltage levels.

Preferably, such a debounce bounce circuit will be able to delay switching its output after an input changes state and remains in that state without reverting to its previous state for a minimum debounce period. The debounce circuit is preferably able to detect reversions to the previous state even if they are for a period shorter than the debounce period. It may further be desirable to provide the ability to provide the debounce delay function when the input transitions from a first state to a second state as well as when it reverts from the second state back to the first state.

SUMMARY OF THE INVENTION

Therefore, according to the present invention there is provided a debounce circuit arranged to receive a clock signal of a first frequency and a pulse signal providing periodic pulses at a second lower frequency, said debounce circuit comprising a first switching unit and a second switching unit; each switching unit including an input stage having an output, a feedback input and one or more inputs; each switching unit further including an output stage having an output and an input; the output of the output stage of the first switching unit being coupled to one of said one or more inputs of the input stage of the second switching unit; each output stage being clocked by the clock signal; the output of each output stage being fed back to said feedback input of the respective input stage; the output of each input stage being provided to the input of the respective output stage; the output of each input stage being selectively coupleable by said input stage to the respective feedback input, dependent on the state of the pulse signal and a control signal provided as one of said one or more inputs of the respective input stage, to maintain the state of the output of the output stage; the output of the input stage also being selectively coupleable by said input stage to one of said one or more inputs of the respective input stage, dependant on the state of the pulse signal and said control signal of the respective input stage, to allow changing of the state of the output of the output stage; a debounce circuit input signal being provided as one of the inputs of the input stage of the first switching unit; a debounce circuit output signal is provided based on the output of said second switching unit.

This arrangement provides the means to monitor an input signal and to delay changing the output of the first and second units until after a delay corresponding to when the next pulse signal occurs. In this way, the debounce delay is provided. The output of each unit is fed back to the input and maintained until a pulse on the pulse signal. This allows the output of the switching unit to change if appropriate. However, to make sure no transient glitches or returns to the original state occur on the input, the switching units continue to monitor the input. If the switching unit detects such a glitch, the output will revert to its original state and on the next transition of the faster clock signal, the output will change. This means that the debounce circuit is effectively reset when a glitch occurs and will not set again until the next pulse on the pulse signal, thereby ensuring a minimum period after the input switches before the output changes.

Preferably, in one arrangement, the control signal of the first switching unit is coupled to the debounce circuit input signal, and the control signal of the second switching unit is coupled to the output of the output stage of the first switching unit.

Each of the input stages is preferably arranged to selectively set its output to a first state when said control signal is in said first state and set its output to a second state when the control signal is in said second state and the pulse signal is in said second state. When none of the above conditions apply, the input stage couples its output to the respective feedback input. This maintains the output in the same state until one of the above conditions applies and the state of the output may change.

The debounce circuit output signal is preferably arranged so that it switches to the second state when the debounce circuit input signal, the output of the output stage of said first switching unit and the output of the output stage of the second switching unit are all in said second state. In this way, an input passes through each stage. Only when the change of state of the input has rippled through are all the conditions met and the debounce output changes state. Equally when any of the conditions changes, such as the input reverting to its original state then the debounce output again reverts to its original output state.

In a second advantageous arrangement, the control signal of each of the switching units is coupled to the debounce circuit input signal.

In this arrangement, each input stage may be arranged to selectively set its output to a first state when the control signal is in the first state and the input stage of the first switching unit can be arranged to selectively set its output to a second state when the control signal is in the second state and said pulse signal is in the second state. The input stage of said second switching unit can then be arranged to selectively couple its output to the input connected to the output of the output stage of the first switching unit when the control signal is in the second state and the pulse signal is in the second state. If the above conditions are not met though, the output of each of said input stages is preferably coupled to the respective feedback input.

In a third arrangement, a first input of the one or more inputs of each input stage is preferably coupled to the debounce circuit output whilst a second input of the one or more inputs of the input stage of the first switching unit is coupled to the debounce circuit input signal. A second input of the one or more inputs of the input stage of the second switching unit is preferably coupled to the output of the output stage of the first switching unit and the control signal of each switching unit is derived by comparing the debounce circuit output signal and the signal provided to the second input of the input stage of the respective switching unit such that if they are not in the same state, the respective control signal is in the second state.

In the above arrangement, each input stage can be arranged to selectively couple its output to the first input when the control signal is in said first state; and for each input stage to selectively couple its output to the second input when the control signal is in the second state and the pulse signal is in the second state. When none of the foregoing conditions apply, the output of each of said input stages may be coupled to the respective feedback input.

Preferably, the debounce circuit output signal switches to the second state when the debounce circuit input signal, the output of said output stage of the first switching unit and the output of the output stage of the second switching unit are all in the second state. These inputs may be fed to an AND gate for comparing them. The output of the comparison may be used as the clock input of a flip-flop that has its input permanently connected to the second state. In this way once the result of the comparison is positive, the state of the flip-flop changes but then remains in that state.

The debounce circuit output signal preferably switches from the second state to the first state when the debounce circuit input signal, the output of the output stage of the first switching unit and the output of the output stage of the second switching unit are all in the first state. This comparison may be carried out using an OR gate or a NOR gate. The output may be used to control the flip-flop arrangement mentioned above. The output of the NOR gate will be in the second state when all of the inputs are in the first state. This output from the NOR gate can be provided to the reset input of the flip-flop to reset the output of the flip-flop to the first state and again that will be maintained until the signal to the clock input, provided from the AND gate, changes.

The above arrangement is sensitive to the current debounce circuit output status and its operation is modified accordingly. When the debounce circuit output is in the first state, the debounce circuit acts to debounce an input signal switching from the first state to the second state. However, once the debounce circuit output is in the second state, its function changes to providing a debounce of an input transitioning from the second state to the first state.

This is important since when debouncing of signals from a first to second state is carried out, the switching units respond slowly to transitions of the input from first to second states but rapidly when the input returns to the first state. Of course when debouncing in the opposite sense, i.e. debouncing of signals from a second to a first state, the switching units should respond slowly to transitions of the input from second to the first state but rapidly if the input returns to the second state.

Therefore, this arrangement adapts its operation to allow for bidirectional debounce of input signals.

A fourth arrangement is preferably arranged with a first input of the one or more inputs of each input stage coupled to the debounce circuit output signal, a second input of the one or more inputs of the input stage of the first switching unit coupled to the debounce circuit input signal; and a second input of the one or more inputs of the input stage of the second switching unit coupled to the output of the output stage of the first switching unit. The control signal of each switching unit is preferably derived from the debounce circuit input signal and the debounce circuit output signal such that the control signal is in a second state if the debounce circuit input signal and the debounce circuit output signal are not in the same state.

With this arrangement, each of the input stages selectively couples its output to the respective first input when the control signal is in the first state and each of the input stages selectively couples its output to the respective second input when the control signal is in the second state and the pulse signal is in said second state. Otherwise, if none of the above conditions apply, each of the input stages couples its output to the respective feedback input.

The above arrangements include a first and a second switching unit. However, they may also include one or more additional second switching units, each additional switching unit being connected to a preceding second switching unit. In this way, each additional second switching unit is connected in series with the output of one second switching unit being provided to the input of the next switching unit. Otherwise, the additional switching units are arranged similarly to the original second switching unit.

With the above modification to the previous arrangements, where it is indicated that the debounce output circuit is based on the output of the second switching unit, this should be read as meaning the final one of the second switching units in the sequence. Similarly where the debounce output is based on the debounce input signal and the output of the first and second switching units, this should be read to mean that the debounce output is based on the debounce input signal, the output of the first switching unit and the outputs of each of the second switching units.

In the above arrangements, the output stages are preferably flip-flops.

A synchroniser is preferably provided to synchronise the debounce circuit input signal with the clock signal. The debounce circuit input may be pre-synchronised or the debounce circuit may be arranged to include the synchroniser to synchronise the debounce circuit input signal prior to passing it to the switching units.

The present invention also provides a method of debouncing a debounce input signal to provide a debounce output signal, the method comprising: a first delay step to produce a first delayed signal; and a second delay step arranged to receive said first delayed signal to provide a second delayed signal, wherein said first delay step comprises: a first stage arranged to output a first stage output signal, the first stage output signal being selected from said first delayed signal and one of one or more first stage input signals, dependent on the state of a pulse signal and a control signal provided as one of said one or more first stage input signals; and a second stage arranged to receive and delay said first stage output signal according to a clock signal to provide said first delayed signal, said second delay step comprises: a third stage arranged to output a third stage output signal, the third stage output signal being selected from said second delayed signal and one of one or more third stage input signals, dependent on the state of said pulse signal and a control signal provided as one of said one or more third stage input signals; and a fourth stage arranged to receive and delay said third stage output signal according to said clock signal to provide said second delayed signal, wherein the debounce input signal is provided as one of said one of one or more first stage input signals; said debounce output signal is provided based on said second delayed signal; and the pulse signal has a first period greater than the period of said clock signal.

Preferably, the control signal of the first stage is said debounce input signal and the control signal of said second step is the first delayed signal. Further said method can be arranged so that said first stage output signal is in a first state when the respective control signal is in the first state, and in a second state when the respective control signal is in the second state and the pulse signal is in the second state; and the third stage output signal is in a first state when the respective control signal is in the first state, and in a second state when the respective control signal is in the second state and the pulse signal is in the second state, otherwise the third stage output signal is provided from the second delayed signal.

Preferably, with this method, the debounce output signal is in said second state when the debounce input signal, the first delayed signal and the second delayed signal are all in said second state.

Alternatively, the method may be carried such that the control signal of each of first and third stages is provided from the debounce input signal. In this way, the first stage output signal will be in a first state when the respective control signal is in the first state, and in a second state when the respective control signal is in the second state and the pulse signal is in the second state, otherwise the first stage output signal is provided from the first delayed signal. Ideally, the third stage output signal is in a first state when the respective control signal is in said first state, and the third stage output signal is provided from the first delayed signal when the control signal is in the second state and the pulse signal is in the second state, otherwise the third stage output is provided from the second delayed signal.

In a further modification of the method of the present invention, a first input of the one or more first stage input signals is provided from the debounce output signal, a second input of the one or more first stage input signals is provided from the debounce input signal; a first input of the one or more third stage input signals is provided from the debounce output signal, a second input of the one or more third stage input signals is provided from the first delayed signal; said control signal of the first delay step is derived by comparing the debounce output signal and the debounce input signal such that if they are not in the same state, the first delay step control signal is in the second state; and the control signal of the third delay step is derived by comparing the debounce output signal and the signal provided to said second input of the third stage such that if they are not in the same state, the third delay step control signal is in the second state.

With this further modification, the first stage output signal may be provided from the first input of the first stage when the control signal is in the first state, the first stage output signal provided from the second input of the first stage when the control signal is in the second state and the pulse signal is in the second state, otherwise the first stage output signal is provided from the first delayed signal. Furthermore, the third stage output signal is provided from the first input of the third stage when said control signal is in the first state, the third stage output signal is provided from the second input of the third stage when the respective control signal is in the second state and the pulse signal is in the second state, otherwise the third stage output signal is provided from the second delayed signal.

Preferably, with the above method, the debounce output signal switches to the second state when the debounce input signal, the first delayed signal and the second delayed signal are all in the second state.

Furthermore, the debounce output signal preferably switches from the second state to the first state when the debounce input signal, the first delayed signal and the second delayed signal are all in said first state.

A further modification of the above method provides that a first input of the one or more first stage input signals is provided from the debounce output signal, a second input of the one or more first stage input signals is provided from the debounce input signal; a first input of the one or more third stage input signals is provided from the debounce output signal, a second input of the one or more third stage input signals is provided from said first delayed signal; and the control signals of the first and third delay steps are derived by comparing the debounce output signal and the debounce input signal such that if they are not in the same state, the first and third delay step control signals are in the second state.

With this method, the first stage output signal is preferably provided from the first input of the first stage when said control signal is in the first state, the first stage output signal is provided from the second input of the first stage when the control signal is in the second state and the pulse signal is in the second state, otherwise the first stage output signal is provided from the first delayed signal. In addition, the third stage output signal may be provided from the first input of the third stage when the control signal is in the first state, the third stage output signal provided from the second input of the first stage when the control signal is in the second state and the pulse signal is in the second state, otherwise the third stage output signal is provided from the second delayed signal.

An another aspect of the present invention also provides a debounce circuit arranged to receive a clock signal of a first frequency and a pulse signal providing periodic pulses at a second lower frequency, said debounce circuit comprising: a first switching unit and one or more second switching units arranged in series, each switching unit having an input and an output, said output being clocked by said clock signal, and a comparator having an output arranged to provide an output signal in the second state when each of: the input of the first switching unit; the output of the first switching unit and the output of each of the second switching units is in the second state, wherein: a debounce circuit input signal is provided to the input of the first switching unit; the output of first switching unit is coupled to the input of a first one of the second switching units; the input of any additional second switching units is connected to the output of the preceding second switching unit in the series; the respective output of each of said first and second switching units will change from a first state to a second state after a pulse on said pulse signal when the respective input of the switching unit is in said second state; the respective output of each of said first and second switching units will change from said second state to said first state when the respective input of the switching unit changes to said first state; and a debounce circuit output signal is provided based on the output of said comparator.

The present invention also provides a debounce circuit arranged to receive a clock signal of a first frequency and a pulse signal providing periodic pulses at a second lower frequency, said debounce circuit comprising: a first switching unit having a first input and an output, said output being clocked by said clock signal, and one or more second switching units arranged in series, each second switching unit having a first input, a second input and an output, said output being clocked by said clock signal, wherein: a debounce circuit input signal is provided to the first input of each of the first and one or more second switching units; the output of the first switching unit is coupled to the second input of a first of the second switching units; the second input of any additional second switching units is connected to the output of the respective preceding second switching unit; the output of the first switching unit will change from a first state to a second state after a pulse on said pulse signal when the first input of said first switching unit is in said second state; the output of a second switching unit will change from said first state to said second state after a pulse on said pulse signal when the first and second input of that second switching unit is in said second state; the output of the first switching unit output will change from said second state to said first state when said first input changes to said first state, the output of a said second switching unit will change from said second state to said first state either when said first input changes to said first state or after a pulse on said pulse signal when the second input of that switching unit is in said first state; a debounce circuit output signal is provided from the output of last in the series of said second switching units.

The present invention additionally provides a debounce circuit arranged to receive a clock signal of a first frequency and a pulse signal providing periodic pulses at a second lower frequency, said debounce circuit comprising: a plurality of switching units arranged in series, each switching unit having a first input, a second input and an output, said output being clocked by said clock signal, the second input of a first of said switching units being coupled to a debounce circuit input and the second inputs of the rest of said switching units are each coupled to the output of the respective preceding switching unit; and a comparator having an output arranged to provide a debounce circuit output, the debounce circuit output being coupled to the first input of each of the switching units, wherein: the output of a said switching unit will change from a first state to a second state when the second input signal is in said second state and either said first input is in said second state or after a pulse on said pulse signal when said first input is in said first state; the output of a said switching unit will change from said second state to said first state when the second input is in said first state and either said first input is in said first state or after a pulse on said pulse signal when said first input is in said second state; the debounce circuit output from said comparator will change from said first state to said second state when the second input of the first switching unit and all the outputs of all the first and second switching units are in said second state; and the debounce circuit output from said comparator will change from said second state to said first state when the second input of the first switching unit and all the outputs of the first and second switching units are in said first state.

The present invention further provides a debounce circuit arranged to receive a clock signal of a first frequency and a pulse signal providing periodic pulses at a second lower frequency, said debounce circuit comprising: a plurality of switching units arranged in series, each switching unit having a first input, a second input, a third input and an output, said output being clocked by said clock signal, the first input of each of said switching units being coupled to a debounce circuit output, the second input of a first of said switching units being coupled to a debounce circuit input and the second inputs of the rest of said switching units are each coupled to the output of the respective preceding switching unit; and a comparator for comparing said debounce circuit input to said debounce circuit output to provide an output in said second state when said debounce circuit input and said debounce circuit output are in the same state, the output of said comparator being coupled to the third input of each of said switching units, wherein: the output of a said switching unit will change from a first state to a second state under any one of the following conditions: said first input is in said second state and said third input is in said first state, after a pulse on said pulse signal, said second input and said third input are both in said second state, and after a pulse on said pulse signal, said first input and said second input are both in said second state; the output of a said switching unit will change from said second state to said first state under any one of the following conditions: said first input and said third input are both in said first state, and after a pulse on said pulse signal, said second input is in said first state and said third input is in said second state; and a debounce circuit output signal is provided from the output of last in the series of said switching units.

In the debouncing circuits and methods above, the operation is described in terms of specific states. These first and second states may be logic high and logic low or vice versa but it will be appreciated that the arrangements described above and the specific embodiments described below may be modified so that individual inputs and outputs may be adjusted to operate with opposite states whilst the overall circuit and method still operates in the same way according to the invention. A man skilled in the art will ready appreciate that these changes may be made to accommodate simpler gate arrangements or for other reasons. It is intended that all such modifications are encompassed by the invention.

In the above circuit and method, the pulse signal is preferably by a pulse signal generator having a delay means for delaying a second clock signal by one period of said clock signal and providing an output pulse when said delayed second clock signal is in said first state and said second clock signal is in said second state. The delay means may be a flip-flop.

A further configuration according to the invention provides a circuit for delaying a change of state of an output until the state of an input has been unchanged for a minimum period after an initial change, the circuit comprising: a delay section comprising a plurality of delay units arranged sequentially, the output from each delay unit other than the final delay unit is passed as an input to a subsequent delay unit; the output from the final delay unit is provided as an output of the delay section; and the input to the debounce circuit is coupled to the input of a first of the delay units, wherein each delay unit is arranged to delay the change of state of its output from a first state to a second state after a change of state of an input from a first state to a second state until a transition on a first timing signal occurs, and each delay unit is arranged to revert to the first state if the input reverts to the first state once a transition on a second timing signal is received, the second timing signal having a shorter period than the first timing signal.

A still further configuration according to the invention provides a debounce circuit for delaying a change of state of an output until the state of an input has been unchanged for a minimum period after an initial change, the circuit comprising: a delay section comprising a plurality of delay units arranged sequentially, the output from each delay unit other than the final delay unit is passed as an input to a subsequent delay unit; the output from the final delay unit is provided as an output of the delay section; and the input to the debounce circuit is coupled to the input of a first of the delay units, wherein when said debounce circuit output is in a first state: each delay unit is arranged to delay the change of state of its output from said first state to a second state after a change of state of an input from said first state to said second state until a transition on a first timing signal occurs; and each delay unit is arranged to revert to the first state if the input reverts to the first state once a transition on a second timing signal is received, the second timing signal having a shorter period than the first timing signal, and when said debounce circuit output is in a second state: each delay unit is arranged to delay the change of state of its output from said second state to said first state after a change of state of an input from said second state to said first state until a transition on said first timing signal occurs; and each delay unit is arranged to revert to the second state if the input reverts to the second state once a transition on said second timing signal is received.

The present invention also provides a debounce circuit for delaying a change of state of its output until the state of an input has been unchanged for a period after an initial change, the circuit comprising: a delay section comprising a plurality of delay units arranged sequentially, the output from each delay unit other than the final delay unit is passed as an input to a subsequent delay unit and the input to the debounce circuit is coupled to the input of a first of the delay units, wherein each delay unit is arranged to delay the change of state of its output after a change of state of an input until a transition on a timing signal is received; a first comparator for determining if the debounce circuit input and the output from all of the delay units are in a second state; and a second comparator for determining if the debounce circuit input and the output from all of the delay units are in a first state; an output stage arranged to switch said debounce circuit output from a first state to a second state when said first comparator determines that all of the delay unit outputs are in a said second state, and to switch said debounce circuit output from a second state to a first state when said second comparator determines that all of the delay unit outputs are in a said first state.

The present invention is ideally suited for use in devices where mechanical switches are provided. It may also be used where voltage levels are being monitored and transient changes in these levels are to be disregarded. This is particularly relevant to battery-operated devices where power supply levels are carefully monitored. The present invention may therefore be usefully applied in many different electronic apparatus, particularly portable devices and battery-operated devices. However, the invention may be applied to other more substantial installation bases such as in cars, trains, or planes where voltage levels may be monitored or where input switches are used and so on.

The skilled person will recognise that the above-described apparatus and methods may be embodied as processor control code, for example on a carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware."

BRIEF DESCRIPTION OF THE DRAWINGS

A specific embodiment of the present invention will now be described with reference to the following drawings, in which:

FIG. 8 shows an alternative arrangement for debouncing an input signal;

DETAILED DESCRIPTION OF THE PREFERRED EMBODIMENTS

Figure 1:
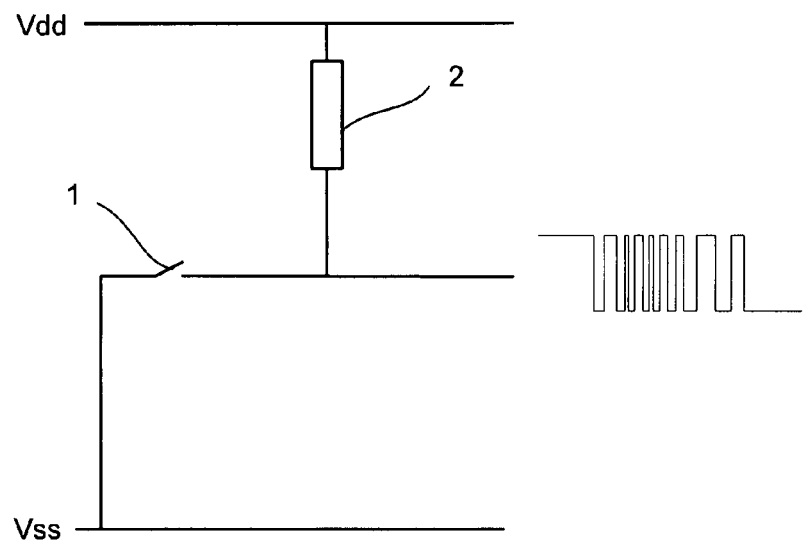
FIG. 1 shows the basic arrangement of a mechanical switch input circuit.
Figure 5:
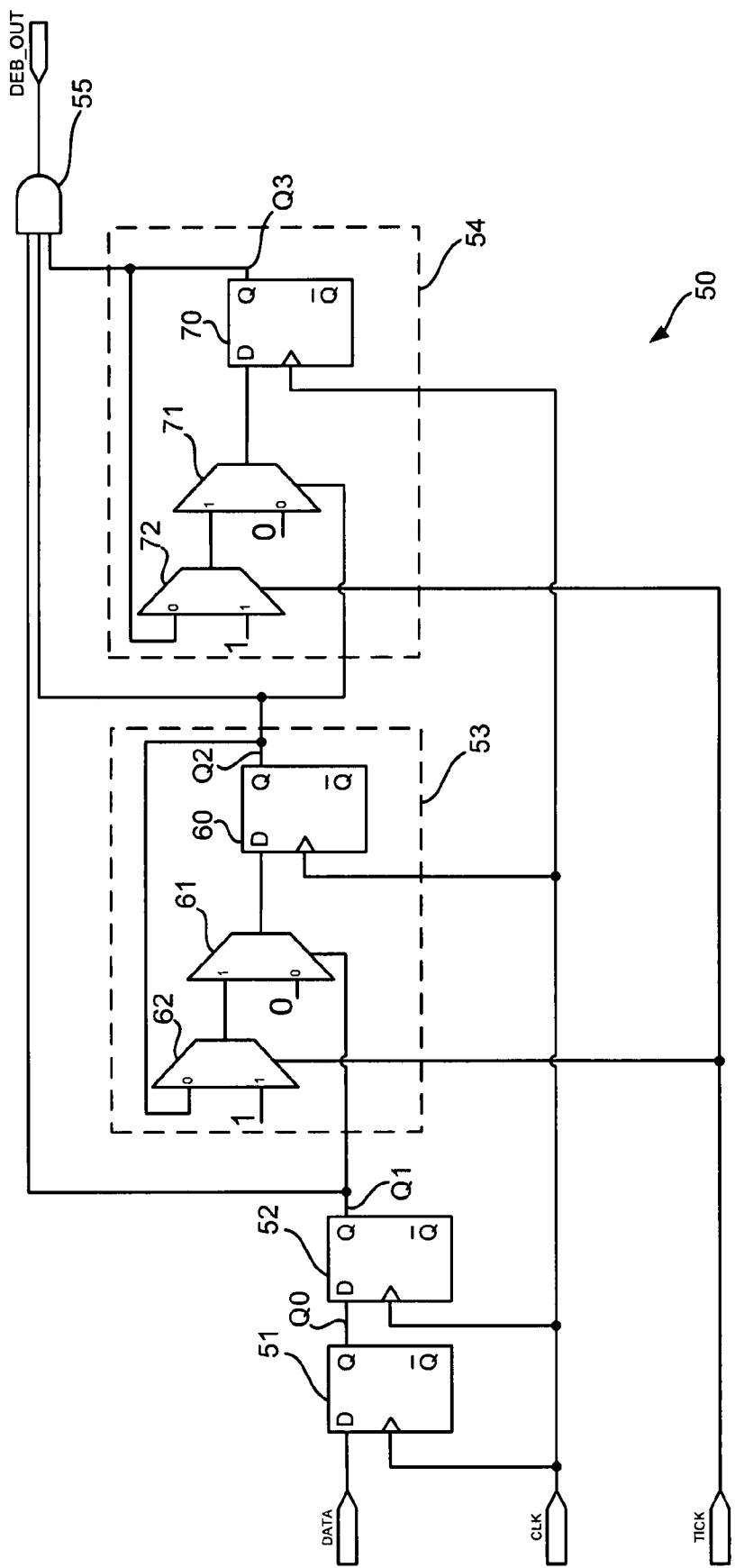
FIG. 5 shows a debounce circuit in accordance with the present invention.

FIG. 5 shows an arrangement of a debounce circuit in accordance with the present invention. The circuit has an input signal (DATA) from a switch, of a type similar to that shown in FIG. 1, although the circuit of FIG. 5 is designed to debounce an input signal switching from low to high. However, this circuit can be easily modified to debounce a signal switching from high to low, e.g. by using the inverting output of the flip-flop 51.

The circuit of FIG. 5 uses two timing signals. The first of these is the high speed system clock, CLK. Digital devices will normally have a common clock signal for synchronising the operation of the device and this can be used for synchronising the input signal to the system clock.

The other timing signal, TICK, is a low frequency signal, which provides a series of short duration pulses spaced over a longer period. The TICK signal will be a much lower frequency than the system clock CLK. This signal may be for example a 1 Hz signal, which is used for setting the debounce time. The pulse will in this embodiment be one system clock cycle in duration.

The operation of the circuit of FIG. 5 will now be described in more detail. The input signal, DATA, is fed to a D-type flip-flop 51 which is clocked by the system clock CLK. The output of this flip-flop is passed to a second flip-flop 52 to provide an output Q1. The flip-flops 51 and 52 operate in a similar manner to the flip-flops 20a and 20b of the circuit of FIG. 2. They serve to synchronise the DATA signal with the system clock. However, because these flip-flops are clocked using the high-speed system clock, any changes in the state of the signal DATA will pass through flip-flops 51 and 52 very rapidly, i.e. between 1 and 2 system clock cycles. Consequently, a change in the signal DATA will cause the output Q1 to change within 2 system clock cycles when the input goes to logic 0.

The output Q1 from the flip-flop 52 is passed to a first delay (switching) unit 53. Delay (switching) unit 53 switches its output state according to the input from the flip-flop 52 but controlled by the system clock and TICK signals. The output from this delay unit Q2 is then passed to a second delay (switching) unit 54 to provide output Q3. The outputs Q1, Q2 and Q3 are each provided to an input of an AND gate 55, the output of which provides the output from the debounce circuit. The delay units 53 and 54 are substantially identical and will now be described with reference to delay unit 53.

Delay unit 53 comprises a flip-flop 60 and two multiplexers 61 and 62. The input Q1 to the delay unit 53, is used as the selector for selecting the input to the multiplexer 61. In this way the input Q1 is arranged to control the input to the multiplexer 61. The multiplexer 62 has its input selected by the TICK signal. The TICK signal is normally low except for the short duration pulse, in this instance once per second where it is high. This means that the output of the multiplexer 62 is the output signal of the delay unit 53, i.e. Q2, except when the TICK signal goes high when '1' is fed as the input to the multiplexer 61.

The delay circuit 53 operates such that if the input Q1 is low, the output of the second multiplexer 61 is always zero and so the output Q2 will be 0 on next cycle of the system clock (CLK). When the input Q1 changes state to 1 then the multiplexer 61 receives its input from the multiplexer 62. In this way, when the TICK signal is low, the output of the flip-flop 60 is fed through multiplexer 62, multiplexer 61 and back to its own input. Consequently, under these conditions, the delay unit 53 simply maintains its output in the same state until the next pulse on the TICK input. When this pulse occurs, the multiplexer 62 switches to the '1' input. This is passed through the second multiplexer to the flip-flop 60, which switches to provide an output Q2 that is high (if it was not already). Once the TICK pulse has passed, multiplexer 62 switches back to feeding the output of the flip-flop 60 back to its own input, effectively maintaining the output signal until the input Q1 changes to low or '0'.

The effect of delay unit 53 is that if the input is low, the output will always be low. However, once the input switches to high, the delay unit switches into a feedback mode maintaining the output by feeding it back to its own input. If the output is zero then it will retain this zero value until the next pulse on the TICK signal when it will switch to the 1 state if Q1 is 1.

Figure 6:
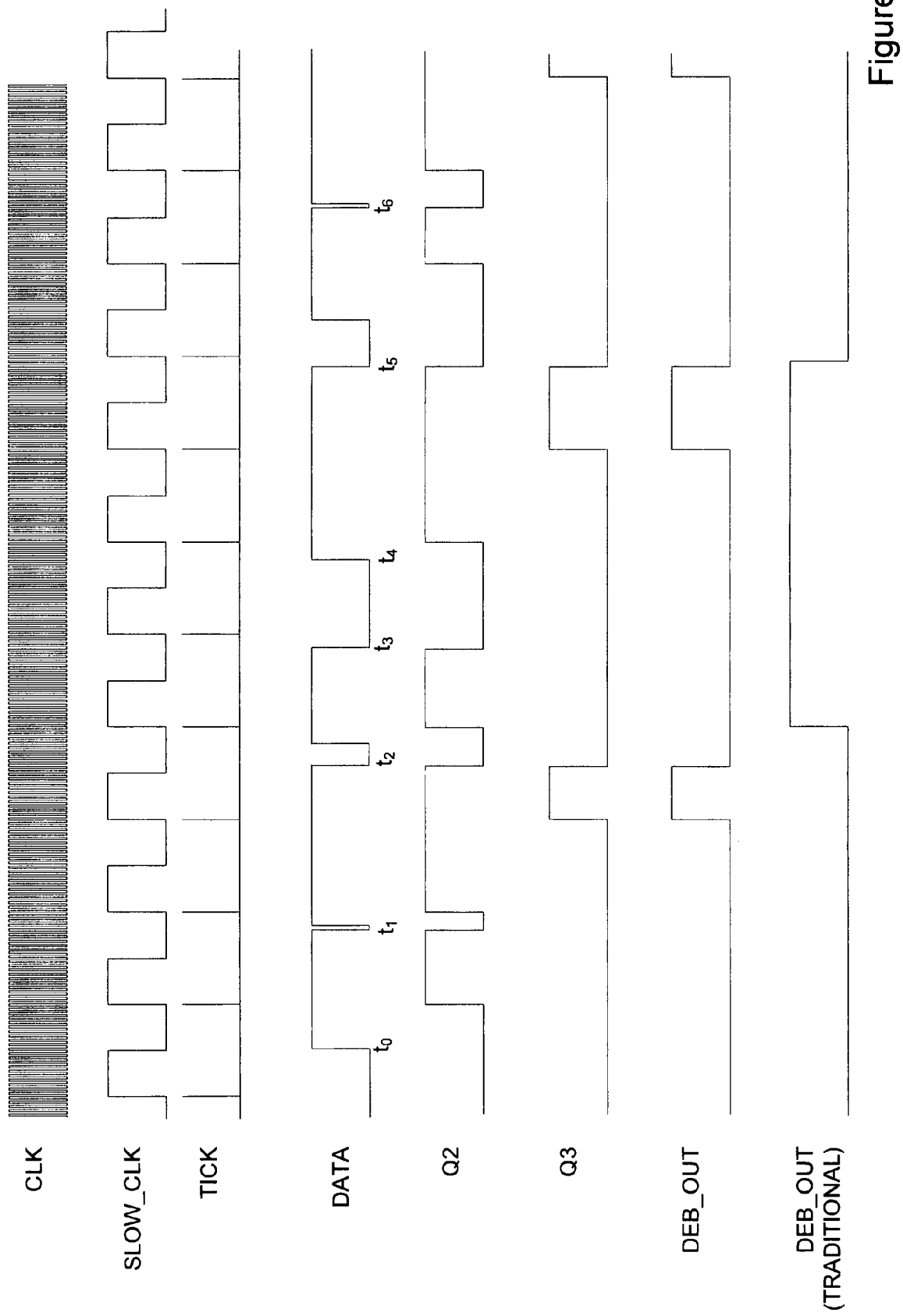
FIG. 6 shows waveforms to assist in explaining the operation of the circuit of FIG. 5.

The operation of this circuit will now be described in detail with reference to FIG. 6. It can be seen from FIG. 6 that a slow speed clock SLOW_CLK provides the low frequency reference for providing the debounce time. This clock is much lower frequency than the system clock CLK, shown schematically in FIG. 6 (although its frequency may be much higher than that shown). The SLOW_CLK signal is used to generate the TICK signal using the circuit of FIG. 4 described below. Referring to FIG. 6, at time $t_0$, the input signal DATA switches to a high state corresponding to the initial closure of the switch contact providing the signal. This change of state is fed to the input of flip-flop 51. The output Q0 of flip-flop 51 will change state at the next transition of the system clock. If the system clock is operating at 1 MHz then the output will change state within 1 μs. Again, flip-flop 52 will change state on the next system clock transition.

As indicated above, the function of the flip-flops 51 and 52 is to synchronise the input data signal with the system clock. Because the output from the flip-flop 52 is synchronised with the system clock, no further synchronization is required where the output of the debounce circuit is used in the system. With the traditional system shown in FIG. 2, the debounced output is synchronised with the SLOW_CLK signal and so if it is desired to use it elsewhere in the circuit, it is necessary to synchronise it with the, usually faster, system clock of the rest of the circuit.

Consequently, the input Q1 to delay circuit 53 will change state within two system clock cycles of the input signal data changing state. This means that the multiplexer 61 which was previously outputting a low signal will be switched into receiving the input from multiplexer 62 and the output of the flip-flop 60 will then be fed back to the input. This will initially maintain the output in the low state. At the next pulse on the TICK signal, the multiplexer 62 will switch its input to the high signal and the output Q2 will change to high. Whilst the input Q1 to the delay unit 53 remains high, the output Q2 will be fed back to the input and the output Q2 will remain high.

The delay unit 54 operates in a similar way to delay unit 53. Once the output Q2 has gone high, the multiplexer 71 in delay unit 54 switches to receiving the output from multiplexer 72 as an input. This begins feeding the output Q3 from the flip-flop 70 back to its own input. Again, this condition will remain until the next pulse on the TICK signal when the output Q3 will switch to the high state. At this time, assuming the signal on the input data has remained high, all of the outputs Q1, Q2 and Q3 will be high and so the output of the AND gate 55 will switch to high providing a high output from the debounce circuit.

It can be seen from the above that a change in the input will pass through the circuit to give a change in the output after 2 cycles or pulses of the TICK signal plus between 1 and 2 cycles of the faster CLK signal.

Referring again to FIG. 6, the input signal DATA has a short duration glitch at time $t_1$ due to switch bounce. As the flip-flops 51 and 52 are both clocked using the system clock, as long as the glitches are longer than one system clock cycle, it is guaranteed that the transition will be captured by the flip-flop 51, causing the output Q0 and then Q1 to switch to the low state in successive clock cycles. The multiplexer 61 will then switch its input to the low input so that the input to the flip-flop 60 becomes low. Again, because the flip-flop 60 is clocked using the high speed system clock, at the next system clock transition, the output Q2 of the flip-flop will switch to low. As Q2 switches to the low state, this switches the multiplexer 71 maintaining output Q3 in the low state. Similarly if the output DEB_OUT was already high and a transition occurs such as that at $t_2$, the output Q1 rapidly goes low, causing the AND gate 55 to switch states and DEB_OUT to switch to low. The low-going edge then propagates to Q2 and Q3 in successive clock cycles, keeping DEBOUT low even if Q1 reverts to a high state.

Consequently, the change of the state of input DATA causes the outputs Q1 and Q2 to switch to the low state within only a few (2-3) system clock cycles. In other words, the transition from low to high propagates through the delay units 53 and 54 at the pulse rate of the TICK signal but transitions from high to low which may occur as short duration glitches, pass through the delay unit at the rate controlled by the system clock.

As can be seen from FIG. 6, the time from the signal DATA changing back to the high state after the glitch at $t_1$, to the output switching to high is between 1 to two periods of the TICK signal. The output signal will revert to zero, even with very short duration transitions, within at most two system clock cycles. In contrast, as shown in FIG. 6, the output DEB_OUT (TRADITIONAL) of the traditional circuit shown in FIG. 2 would not register the negative transition at $t_1$ or $t_2$ at all.

In the example, the DATA signal subsequently has a longer duration transition to zero at $t_2$, which falls between consecutive transitions of the slow clock signal. Because this transition does not coincide with any clock transition, the arrangement shown in FIG. 2 would not register this and the output would remain high. In contrast, because the system of the present invention responds to the transition within two system clock cycles, Q1 and DEBOUT rapidly switch to the low state followed by the output signals Q2 and Q3 shortly thereafter.

As can be seen from the example in FIG. 6, after even a short duration transition such as that shown at $t_1$ or $t_2$, the output will not switch to high again until at least one TICK period has passed.

In FIG. 6, the input DATA remains low long enough for a clock transition of SLOW_CLK to occur. Only when this happens does the arrangement of FIG. 2 register the change and the low state start to percolate through the system. Eventually the output DEB_OUT (TRADITIONAL) switches to low. In this period, the traditional system failed to observe the bounce on the input at $t_1$ or the brief return to zero input at $t_2$.

FIG. 6 shows further transitions of the input signal at $t_4$, $t_5$ and $t_6$. Again, between $t_4$ and $t_5$ the input remains in the high state for two pulses of the TICK signal and so the output goes high. Again, at $t_5$ the input goes low and the output rapidly (within two 2 fast clock cycles) switches back to the low state. The subsequent transition of the input back to high restarts the debounce process but the input transiently dips down to low again at $t_6$, resetting the debounce process.

Figure 7A:
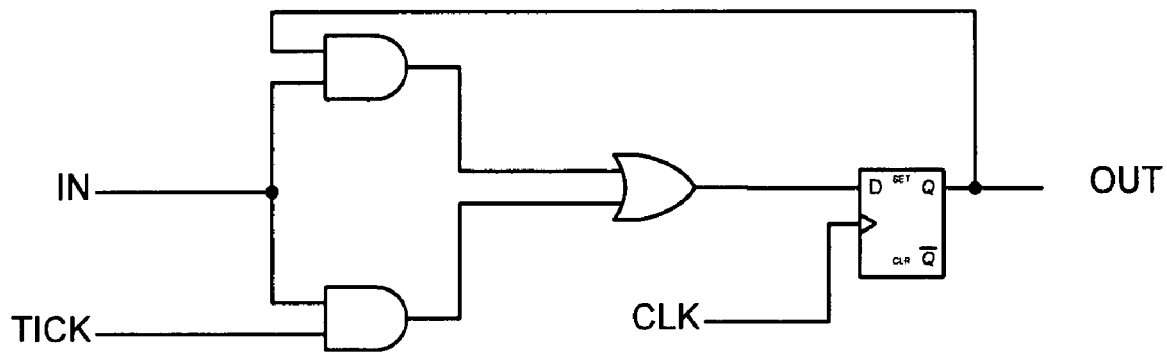
FIGS. 7a, 7b and 7c show exemplary implementations of a delay unit useable in the present invention.
Figure 7B:
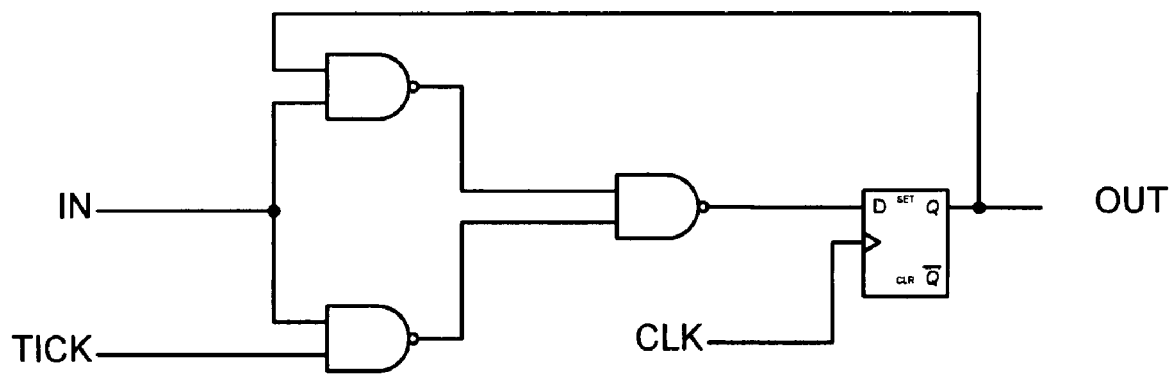

The design described above and as shown in FIG. 5 includes delay units that utilise two multiplexers. However, it will be appreciated that in implementing these elements, the logic components may be optimised to simplify the layout. FIGS. 7*a* and 7*b* show examples of an implementation of the two multiplexers using three simple logic gates. These gates provide the same functionality as the multiplexer arrangement described above.

Figure 7C:
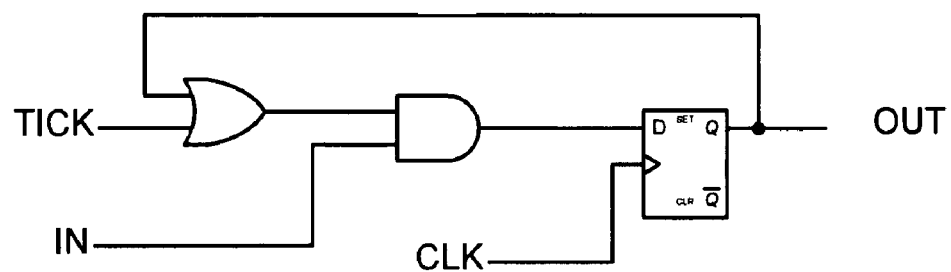

Looking at FIG. 7*a*, it will be clear that if the IN signal is low then both the AND gates are disabled and the output of the OR gate is low. When the IN signal goes high, both the AND gates are enabled and the output of the flip-flop is fed back to the OR gate and hence back to the input of the flip-flop, thereby maintaining the output state. When the TICK signal goes high during the pulse, the output of the OR gate is forced to be high irrespective of the output and the feedback through the first AND gate then maintains that high state once the TICK signal has reverted to the low state. The output is only reset to low when the IN signal goes low again. FIG. 7*c* shows a further alternative layout.

Figure 4:
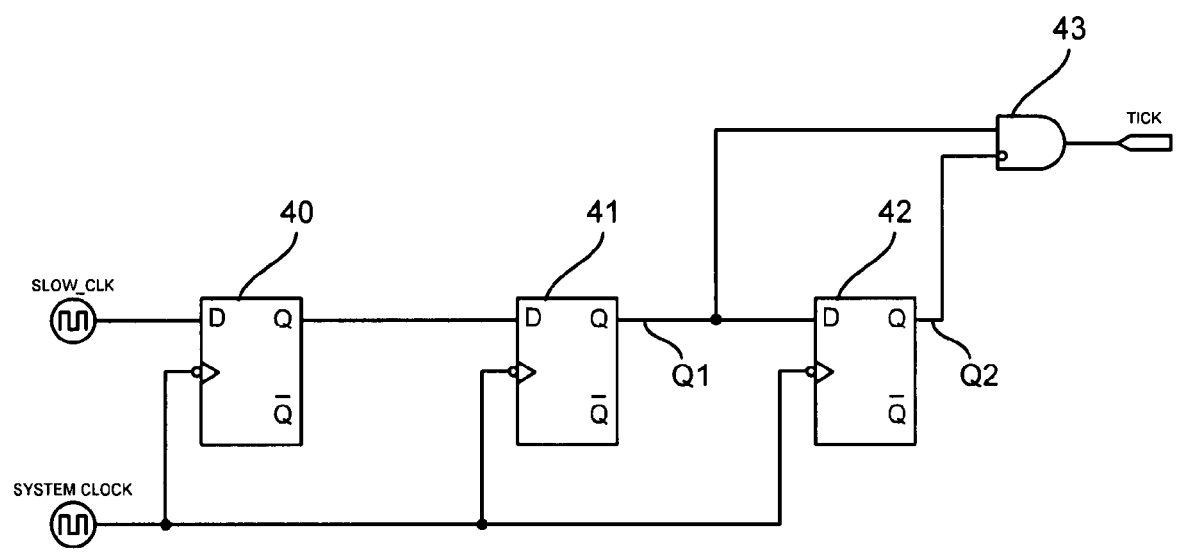
FIG. 4 shows a circuit used for providing a clock signal for use with the debounce circuit of the present invention.

FIG. 4 shows an example of a circuit suitable for generating the TICK signal used in the circuit of FIG. 5. The circuit receives both a low speed clock and a higher frequency clock such as the system clock. Using the system clock is convenient as it ensures that the output from the debounce circuit is synchronised with other system components that may receive the output. The slow clock can be a dedicated clock used for setting the debounce time or may be a clock used for other system functions.

The slow clock is provided as an input to a D-type flip-flop 40. The flip-flop is clocked by the faster system clock. The output for the flip-flop 40 is provided as an input to a second flip-flop 41, which is also clocked by the system clock. The output from flip-flop 41 is a signal which is similar to the input slow clock signal but delayed by 2 system clock cycles but also synchronised to the system clock. The output Q1 for the flip-flop 41 is provided to an input of an AND gate 43 and also to the input of a third flip-flop 42.

The third flip-flop is also clocked by the system clock and provides a signal which is again similar to the input clock signal but delayed by a further system clock cycle. The output Q2 from this flip-flop is provided to an inverting input of the AND gate 43. The signal Q2 is identical to the signal Q1 but delayed by 1 system clock cycle. Consequently, when Q1 and Q2 are both low. The output from the AND gate is also low. As Q1 goes high, Q2 does not go high for one system clock cycle and for this duration, the output of the AND gate 43 goes high. Once Q2 goes high, the output of the AND gate goes low again. When Q1 goes low, the AND gate output remains low. The output of the AND gate, TICK, therefore only goes high for one system clock cycle after each positive transition of the slow clock signal. This provides a pulse with a duration of one system clock cycle, which repeats once for each slow clock cycle. It should be noted that the flip-flops 40, 41, 42 are clocked by an inverted system clock signal. This ensures that the TICK signal changes at the falling edge of the system clock and remains stable until the next falling edge. The delay unit is clocked by the rising edge of the clock, ensuring that the TICK signal is stable at the sample time of the flip flops, thereby providing half a system clock cycle as the setup time.

Whilst a tick signal needs to be generated for use in the debounce circuit, a single tick signal generator can be used for providing the TICK signal for all the debounce circuits in a chip or device. Furthermore, since the TICK signal is used to control the multiplexers, it is not essential to build a clock tree for the signals. It is normal in chip design to have carefully planned clock trees that distribute the system clocks around the chip to ensure that the clocked devices receive substantially synchronised clock pulses. Such clock trees are difficult and expensive to design and lay out. Thus only the system clock needs to have a clock tree, which would be expected anyway.

The avoidance of having to provide a clock tree for the TICK signal means that design changes do not involve a complete clock tree redesign. Connections can be added to or removed from the TICK source without adverse affects on the signal distribution from a central source.

In FIG. 4, if the TICK is generated on the negative edge of the clock and the other system logic runs off the positive edge of the clock then this means that there is half a clock cycle after the start of the pulse in the tick signal before the next positive going pulse of the clock, allowing the logic time to set up and thereby providing a robust design without the need to generate the TICK signal locally.

The circuit described above relates to providing debounce for a switch input, which changes from low to high. However, it will be appreciated that the invention equally applies to transitions from high to low. Similarly, the output from the circuit above reflecting transitions from low to high reflecting the switch input but this could easily be reversed to provided a debounced and inverted output based on the switch input.

Figure 2:
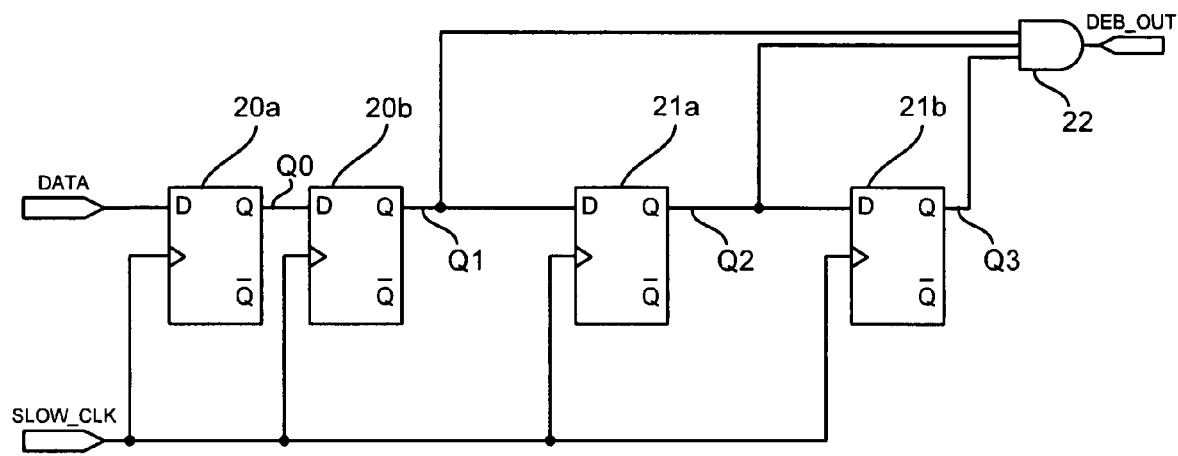
FIG. 2 shows an example of a debounce circuit.
Figure 3:
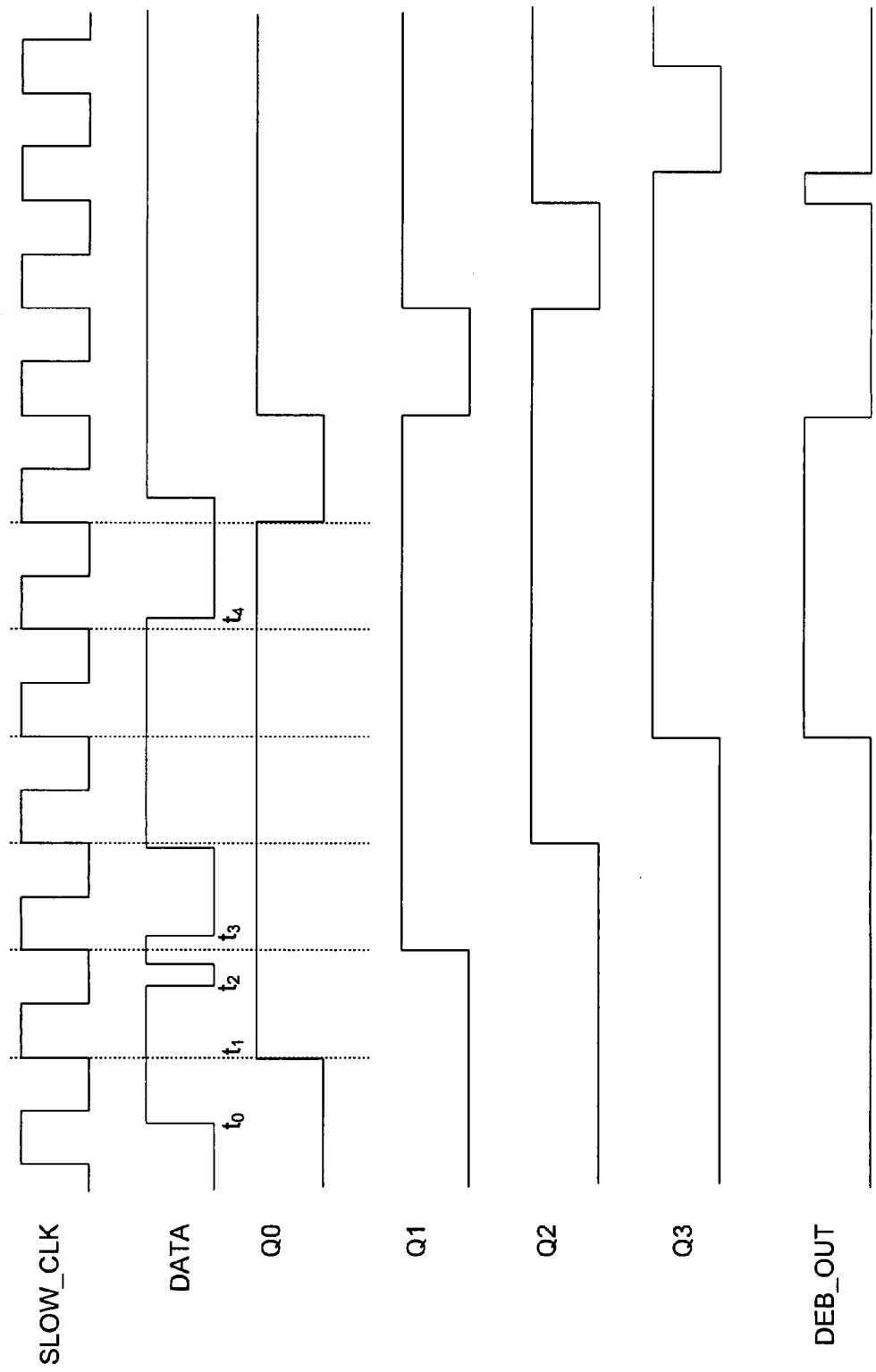
FIG. 3 shows typical operation of the circuit of FIG. 2.

The prior art circuit, shown in FIG. 2, transition from logic '0' to logic '1' on the input (DATA) signal has a latency of up to four cycles of the SLOW_CLK, even though the debounce duration is only two cycles of SLOW_CLK. The additional latency comes about as a result of the latency of the synchronisers 20a and 20b. In the arrangement shown in FIG. 5, which is in accordance with the present invention, the equivalent latency is two cycles of the SLOW_CLK plus a maximum of two cycles of the faster system clock (CLK). As the system clock is likely to be substantially faster than the SLOW_CLK then the latency is effectively reduced by two cycles of the SLOW_CLK clock.

In addition, where the switch has been closed and the input has switched to logic '1' and the debounce period has passed, such that the output has also switched to high, when the switch is released and the DATA signal reverts to logic '0', there is a latency of 2 SLOW_CLK cycles before the output also reverts to logic '0'. In contrast, with the present invention, the latency of the debounce circuit for detecting return to logic '0' is two cycles of the CLK signal, which compared to the SLOW_CLK signal is virtually instantaneous.

Consequently, the present invention provides a debounce circuit which will detect even very short transition bounces during the debounce period but will also respond much more rapidly to release of the switch or change in the signal DATA. Furthermore, this is achieved with a circuit which requires a minimal number of additional components and no significant increase in the power requirement of the circuit.

The above embodiment of the invention has been described in relation to providing a debounce function to an input from a switch particularly a mechanical switch. However, the debounce function can be used in other applications where rejection of transients is required. This may occur where a supply voltage is being monitored. For example, in a portable device, the battery supply may be monitored to ensure that sufficient power is left. Similarly, if an external supply is being used, this may be monitored to make sure that when it is switched off, the device can smoothly switch to its battery source. This typically involves monitoring the voltage of the monitored supply. The input signal would represent the monitored voltage relative to a threshold. The monitoring device will determine when the voltage falls below a predetermined level, particularly with a battery which will have a steadily decaying voltage as it discharges. However, a battery with sufficient charge or an external supply may suffer transient dips in supply voltage where there are surges in power demand, for example when a hard drive is started or during a transient demand from an amplifier. If these dips cause the voltage to drop below the threshold, the supply will be determined to be out of tolerance and switched out. If this happens regularly, this can have undesirable effects such as slow charging, power supply disturbance etc. It is therefore desirable to avoid switching on such transients. By providing the output of the comparison to the threshold to a debounce circuit, such transients will be ignored unless they persist for a predetermined duration. Equally, if the supply recovers, this will be noted within a clock cycle.

The same can be applied to monitoring for when a voltage level comes into a desired range. For example in a battery operated device, the external supply may be monitored by the circuit of the invention to ensure that the supply is available and has been available for the 'debounce time' before switching from the battery supply to the external supply.

Again, whilst voltage monitoring is described above, other levels can be monitored, such as temperature, where again transient deviations may want to be disregarded.

A modified embodiment of the present invention is shown in FIG. 8. In this embodiment, like parts have been given similar reference numerals. In the arrangement shown in FIG. 8, the synchronization flip-flops 51, 52 are the same as those in the arrangement shown in FIG. 5. In this embodiment, the delay (switching) units 83 and 84 are also provided. Delay (switching) unit 83 is essentially identical to delay (switching) unit 53. However, delay (switching) unit 84 is configured differently to delay (switching) unit 54 of FIG. 5. Whilst delay (switching) unit 84 comprises the same elements, it is arranged differently to unit 54. The principle differences are that the control signal for the multiplexer 71 is Q1 rather than the output from the preceding stage. In the delay (switching) unit 54 of the FIG. 5 embodiment the control signal is provided by Q2 from the delay (switching) unit 53. The multiplexer 72 is also modified. Instead of the 1-input (the input corresponding to a high control signal, labelled 1) simply being connected to a high signal, this input is connected to the output of the previous stage.

Therefore, in the delay (switching) unit 84 of FIG. 8, the output of the previous delay unit 83 (Q2) is provided as an input to the multiplexer 72.

Unlike the arrangement of FIG. 5, this embodiment does not require the AND gate 55 to provide the debounce output. Instead, the debounce output is provided from the output of the delay unit 84, i.e. Q3. The operation of the arrangement of FIG. 8 will now be described in detail. The operation of the flip-flops 51 and 52 is the same as that for the arrangement of FIG. 5 and will not be described again here.

Similarly, the delay (switching) unit 83 operates in a similar manner to the delay (switching) unit 53. When the DATA input switches to high, the outputs Q0 and Q1 sequentially go high on the next two clock (CLK) transitions. Once Q1 is high, the output of the delay (switching) unit 83 will switch to high on the next pulse on the TICK signal. In other words, Q2 will go high after a delay of up to one period of the TICK signal once DATA goes high.

Up until this point, the output Q2 will have been low as would the output Q3 from the delay unit 84. Consequently, both the inputs to the multiplexer 72 into delay unit 84 will be low. Therefore the output from the multiplexer 72 will be low irrespective of the state of the TICK signal. Both the inputs to the multiplexer 71 will also be low irrespective of the state of its control signal (Q1) and so the output Q3 will continue to remain in the low state.

However, once Q2 switches to a high output, the operation of the delay unit 84 changes. Now, even when Q3 is still low, the output from the multiplexer 72 will switch to high when the pulse from the TICK signal arrives. Assuming that the input signal DATA continues to remain in the high state then the output Q1 will also continue to be high and the multiplexer 71 will be monitoring the 1-input corresponding to a high control signal. Consequently once Q2 has gone high, then on the next TICK pulse, the output from the multiplexer 71 will switch to high and the D-type flip-flop 70 will latch into the high state providing an output, Q3, which is high.

Figure 9:
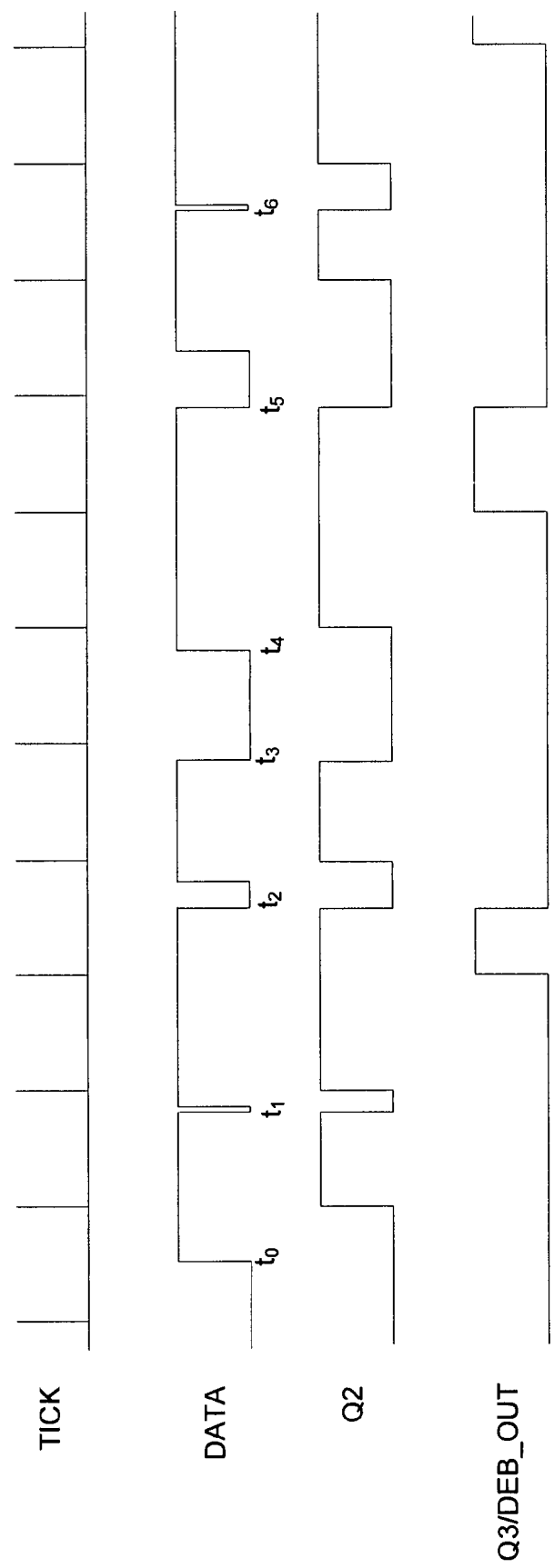
FIG. 9 shows waveforms to assist in explaining the operation of the circuit of FIG. 8.

Consequently, the output Q3 will switch to the high state within one to two periods of the TICK signal. In other words, the output behaves in a similar manner to the arrangement of FIG. 5 (FIG. 9 shows the operation of the circuit of FIG. 8).

As was described above in respect of the arrangement of FIG. 5, if the input signal DATA switches back to a low state then the output DEB_OUT rapidly switches back to the low state. In the arrangement of FIG. 8, a similar effect occurs. If the signal DATA switches to low, the signals Q0 and Q1 also switch to low within two cycles of the high frequency system clock CLK, e.g. at $t_1$ in FIG. 9. Once Q1 switches to zero, the control signals for the multiplexers 61 and 71 in the respective delay units 83 and 84 all switch to the 'zero' input source. Consequently, on the next cycle of the system clock (CLK) the outputs Q2 and Q3 both switch to low.

Thus within one cycle of the system clock, the debounce output reverts to the low state. Thus, the arrangement of FIG. 8 provides an output which only switches to high after the input signal has remained high for a time determined according to the period of the TICK signal whereas it will revert to low within a time determined according to the much lower period of the system clock CLK.

The arrangement above therefore provides similar functionality to the arrangement of FIG. 5 but avoids the need for the additional AND gate 55 for combining the outputs for the delay elements.

As with the arrangement of FIG. 5, the debounce delay can be adjusted by providing additional delay (switching) units, similar to the delay unit 84. Each subsequent unit is arranged with its input connected to the output of the delay unit of the previous stage. The output of the final stage is used as the debounced output (DEB_OUT).

The embodiments described above relate to providing a debounce function for an input transitioning from one state to another. In the specific embodiments above, this is from a low state to a high state. In this way, when the input is in the low state, the output will only switch to the high state after a sufficient period of time to allow for switch bounce. If during the debounce period, the input returns to the low state then the circuit is reset and the output is prevented from changing to the high state. Once the input has changed state and the output has subsequently changed state, the output will remain high until the input goes low again. In the arrangement of FIGS. 5 and 8, the output DEB_OUT switches to low within a few cycles of the fast system clock.

Consequently, the circuits of FIGS. 5 and 8 are not providing any debounce function for the transition from high to low. If the input is connected to an input such as a toggle switch then bouncing may occur both when the switch is opened as well as when it closes. Similarly, if the input is a monitored supply voltage, the supply may suffer glitches which need to be removed by debouncing when transitioning in both directions. It may therefore be desirable to provide a debounce function both to when the input changes from a first state to a second state as well as when the input changes from a second state back to the first state.

Figure 10:
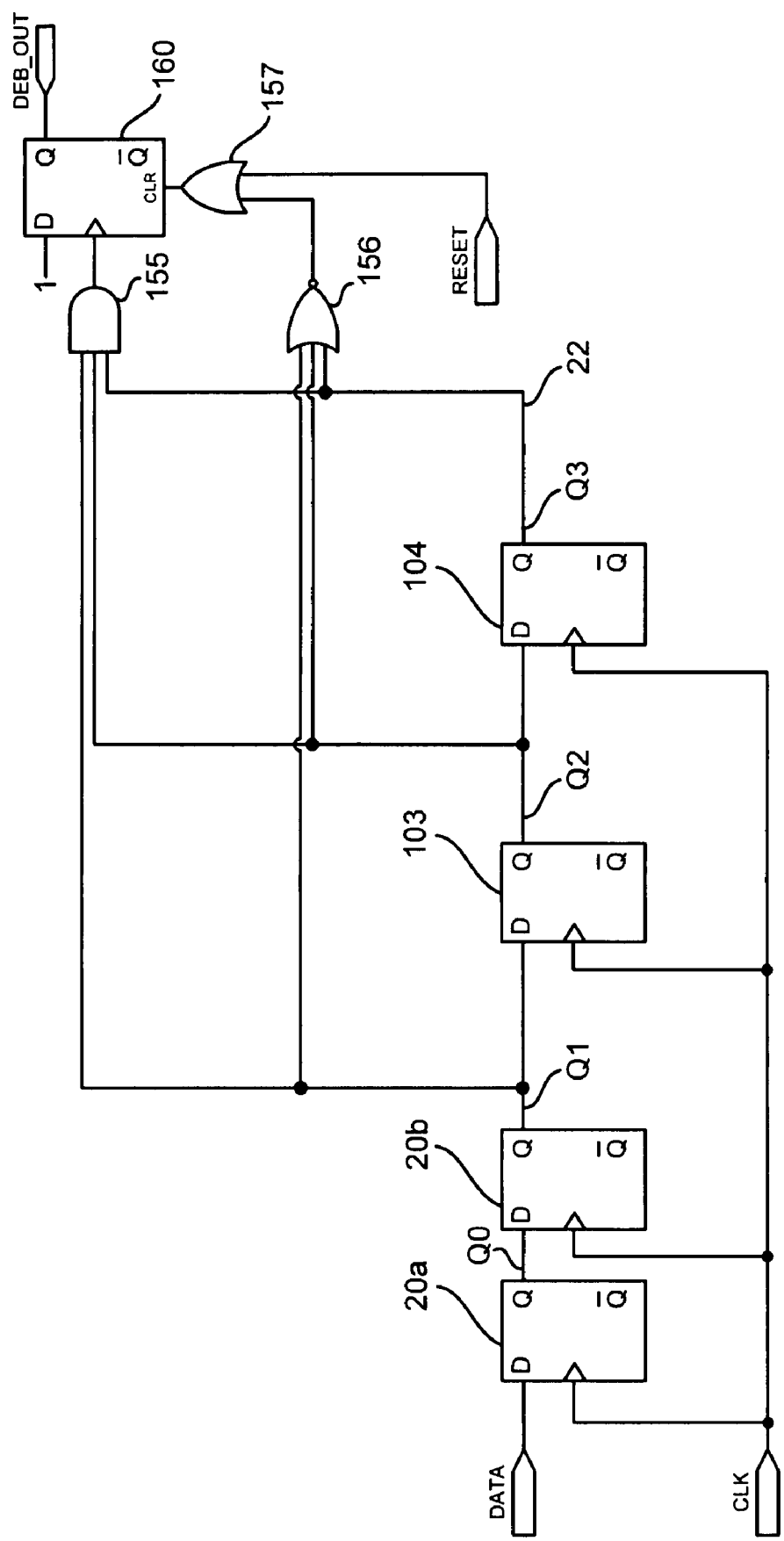
FIG. 10 shows an arrangement for debouncing an input signal transitioning in either direction between high and low states.

The arrangement of FIG. 10 provides a debounce circuit which debounces when switching between a first state and a second state and also when switching back from the second state to the first state. The basic arrangement of the circuit shown in FIG. 10 is similar to that shown in FIG. 2. A signal DATA is received as the input from a switch or other monitored signal and is passed into two flip-flops 20a and 20b. These provide the synchronization function to synchronize the input with the clock. The output from flip-flop 20b is Q1. This is then passed to sequential delay (switching) stages 103 and 104. The respective outputs from these delay stages, Q2 and Q3 are provided along with the output signal Q1 to an AND gate 155.

The output of the AND gate is provided to a further D-type flip-flop 160. The output from the AND gate is provided to the flip-flop as the clock or trigger signal. The D-input to the flip-flop is maintained at the high state.

In this way, when the input signal DATA switches to high, the output from the synchronizer, Q1 then switches to high. After two cycles of the clocking signals to the flip-flops 103 and 104, all of the signals Q1, Q2, Q3 are high and the output from the AND gate 155 also goes high. This causes the Q output from the flip-flop 160 to switch to a high output. In the same way as before, if the input signal switches back to a low level, due to bouncing, then Q1 will switch back to low and the AND gate will not switch to providing a high output.

Once the output of the flip-flop 160 is set to high, the input from the AND gate 155 no longer has any effect. A separate mechanism is provided for returning the output of the flip-flop 160 to the low state. This is provided by the NOR gate 156.

The NOR gate 156 is also connected to the same three inputs as are provided to the AND gate 155. The output of the NOR gate 156 is connected to the reset or clear connection of the flip-flop 160. The NOR gate 156 may be connected either directly or via an OR gate 157 to allow a global reset, as shown in FIG. 10.

After the output of flip-flop 160 is initially set to high, the signals Q1, Q2 and Q3 will all be high. At this stage, the output of the NOR gate will be low and the flip-flop 160 will maintain its high output state. However, once the input signal DATA goes low, then Q1 will initially go low after the signal has passed through the synchronizers 20a and 20b. As Q1 goes low, the output of the AND gate 155 will go low but this will have no effect on the state of the flip-flop 160, as mentioned above. As Q1 goes low, this will have no effect on the output of the NOR gate 156. On the next cycle of the clocking signal for the flip-flop 103, the output Q2 will go low and eventually the output of the flip-flop 104, Q3, will go low. At this stage, (once Q1=Q2=Q3=0) all the inputs to the NOR gate 156 will be low and its output will change to the high state. This will pass to the flip-flop 160 resetting it and causing the output DEB_OUT to go low again.

It will be appreciated that whilst any of the inputs Q1, Q2 and Q3 are high, the output of the NOR gate will not change and the flip-flop 160 will not be reset. This means that if Q1 initially goes low and then Q2 goes low but a bounce on the input signal causes Q1 to go high again then even though the low signal will propagate to the output Q3 the flip-flop 160 will not reset. In other words, the flip-flop 160 will only reset once all the inputs Q1, Q2 and Q3 have gone low, which will be after the input signal has remained low for long enough to allow the low signal to propagate through both of the flip-flops 103 and 104. This effectively provides a debouncing function on the transition back from high to low. Thus in combination with the function of the AND gate 155, the input signal, DATA, is debounced during both the transition from high to low and from low to high.

The arrangement of FIG. 10 provides a bi-directional debounce function to the arrangement of FIG. 2. This uses a relatively slow clock CLK to provide a reasonable debounce time. However, the circuit of FIG. 5 is arranged to deliberately reset Q2 and Q3 within two cycles of the fast clock used in that circuit. Consequently if the input changes from high to low, all three outputs Q1, Q2 and Q3 revert to the low state within two cycles of the fast clock signal. This is in contrast to the transition from low to high which only happens after at least one cycle of the slow TICK clock. Therefore FIG. 11 provides a modified version of the arrangement of FIG. 5 to provide bi-directional debounce functionality, similar to that of the arrangement of FIG. 10.

Figure 11:
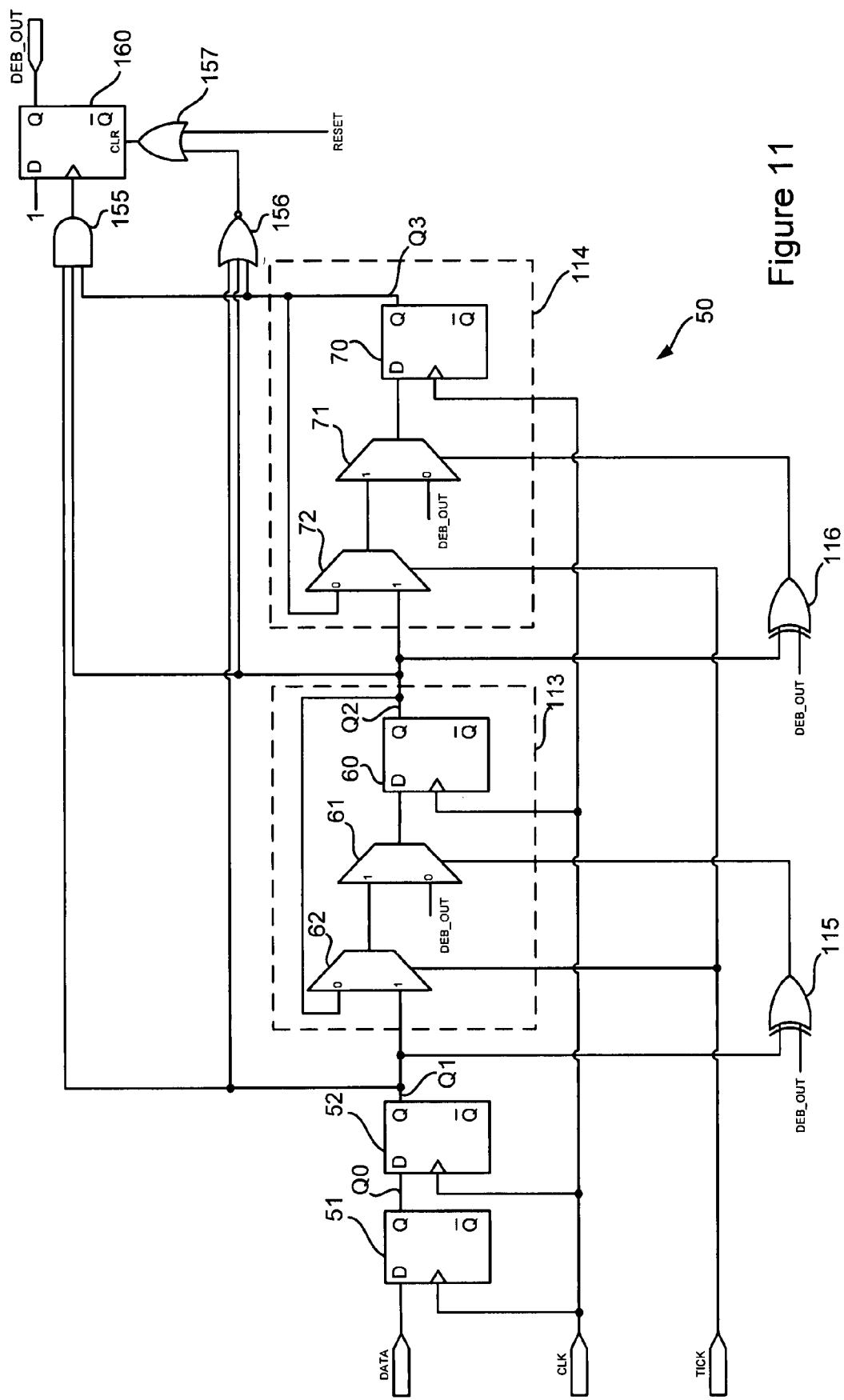
FIG. 11 shows a further arrangement for debouncing an input signal transitioning in either direction between high and low states.

FIG. 11 has the same basic structure as the foregoing embodiments in that it has the two synchronizers 51, 52 with two delay (switching) units 113 and 114 providing outputs Q2 and Q3 respectively. Signals Q1, Q2 and Q3 are provided to an AND gate 155 which has its output provided to a D-type flip-flop 160. The arrangement also has a NOR gate 156 which also receives the signals Q1, Q2 and Q3. The output of the NOR gate is again used to provide a reset signal to the flip-flop 160. The connections to the units 113 and 114 are however modified compared to the previous arrangements.

The arrangement of FIG. 11 is arranged so that the input to each of the units 113 and 114 is provided to the 1-input of the multiplexers 62 and 72 respectively. In addition, the input signals to each of the units 113, 114 are also provided to an XOR gate. These XOR gates each receive the debounced output signal DEB_OUT as a second input. The output of each of these XOR gates is provided to the respective delay unit as a control signal for the second multiplexer 61 and 71 respectively. In addition, the signal provided to the 0-input of the multiplexers 61, 62 is not zero or the low state as was the case in the arrangements for FIGS. 5 and 8 but instead this input for multiplexers 61 and 71 is provided from the debounce circuit output, DEB_OUT.

The operation of the arrangement of FIG. 11 will now be described in detail. Initially, it is assumed that the circuit output DEB_OUT is low and the input DATA is also low. An event occurs and the input signal DATA switches to high. This signal passes through the synchronizers 51 and 52 to cause signal Q1 to switch to high. As Q1 switches to high, the output from the XOR gate 115 switches to high, as the input DEB_OUT is currently low. This causes the multiplexer 61 to switch over to providing the input from the multiplexer 62 as an output. Whilst the TICK signal is low, the multiplexer 62 provides the output signal Q2 as the input to the flip-flop 60. Therefore Q2 remains in the low state.

When the TICK signal has its next pulse, the multiplexer 62 switches to providing the signal on Q1 as the output. As Q1 is now high, the input to the flip-flop 60 is now high and so the output Q2 switches to high.

Assuming Q1 remains high, then the input Q2 to the delay unit 114 causes the output Q3 to become high when the next pulse on the TICK signal arrives. The operation of the delay unit 114 is similar to that of the delay unit 113 described above. As the signal Q3 switches to high, all three inputs to the AND gate 115 are now high and its output causes the flip-flop to provide the high signal on the output DEB_OUT.

The change of state of the output causes the outputs of the XOR gates 115, 116 to switch to zero, assuming signals Q1 and Q2 remain high. The zero output from the XOR gates controls the multiplexers 61 and 71 to provide an output corresponding to the signal on the 0-input. As these inputs are connected to the circuit output, DEB_OUT, then the output from the multiplexers 61 and 62 is high and Q2 and Q3 are maintained in the high state. The circuit then remains in this state whilst the input Q1 remains high.

It should be noted that if Q1 switches to high but then transiently returns to low due to bouncing of the input signal DATA, then the circuit operates in a similar manner to that of FIGS. 5 and 8 causing the outputs Q2 and Q3 to rapidly return to a zero output before the circuit output DEB_OUT switches to high. This is because the output of the XOR gate 115 will switch to zero when Q1 reverts back to zero. This will cause the multiplexer 61 to provide an output corresponding to the 0-input which is the currently low DEB_OUT. Consequently on the next transition of the fast clock CLK, Q2 reverts to a low state. This will have a consequential effect on the output of XOR gate 116 causing the multiplexer 71 to switch to its 0-input and thereby maintain Q3 in the low state. Therefore, the circuit of FIG. 11 operates in a similar manner to FIGS. 5 and 8 in their transition from the low to the high state wherein the input is delayed according to the period of the pulses on the TICK clock but the signals Q2 and Q3 return back to the low state if Q1 returns to the low state even for a short period (as long as that encompasses a transition on the fast clock CLK signal). It should be noted that as soon as Q3 goes high, the output DEB_OUT goes high in the arrangement of FIG. 11. However, if additional stages are added after delay unit 114, then Q3 may be high for one or more periods of the TICK signal before DEB_OUT goes high.

Once the output DEB_OUT has been set, the operation of the circuit of FIG. 11 changes so that a transition of the input back to zero does not immediately reset the output to zero, as will be understood from the explanation below.

Starting from a state where the input is high and the three signals Q1, Q2 and Q3 are high as well as the output of the circuit DEB_OUT. In this state, the multiplexers 61 and 71 are receiving a zero control signal from XOR gates 115 and 166, and so are providing as an output the circuit output signal DEB_OUT provided to their respective 0-inputs. When the input signal DATA transitions to zero, the output, Q1 of the synchronizer will initially switch back to zero. This will cause the output to the AND gate to return to zero but this will have no effect on the output of the flip-flop 160. As Q1 returns to zero, the output of the XOR gate 115 will now become 1 and the multiplexer 61 will switch to monitoring the output from the multiplexer 62. Whilst the TICK signal remains low, the output Q2 is therefore fed back as the input to the flip-flop 60. Q2 will therefore remain in the high state. When the pulse on the TICK signal arrives, the multiplexer 62 switches to providing the input on its 1-input which corresponds to Q1 which will therefore provide, via multiplexer 61, a low output to the flip-flop 60 causing Q2 to switch to low.

In a similar way, once Q2 goes low, the output of the XOR gate 116 switches to high causing the multiplexer 71 to monitor the output of the multiplexer 72. Whilst the TICK signal remains low, the input to the flip-flop 70 will simply be its own output, Q3. However, on the next pulse of the TICK signal, the input to the flip-flop 70 will correspond to Q2 which will therefore cause Q3 to switch to the same state as Q2, i.e. low. Once all of the signals Q1, Q2 and Q3 are low, the output of the NOR gate 156 will switch to high. This will send a reset signal to the flip-flop 160 causing the output DEB_OUT to switch to the low state. This will revert the circuit to the initial conditions, referred to above.

It will be appreciated that once the input DATA switches from high to low, it will take at least one period of the TICK signal before the output returns to low. This again provides the necessary delay for providing the debounce function for the transition from high to low.

If the input Q1 switches from high to low but then transiently returns to high, due to bouncing of the input signal, then the circuit is effectively reset and the output remains in a high state. This will be explained in more detail here. As explained above, when Q1 switches from high to low, when the output DEB_OUT is high, the delay unit will switch the output Q2 to low on the next pulse on the TICK signal. However, at this stage the output Q3 is still high and so the output DEB_OUT remains in the high state. If Q1 transiently returns to the high state, then because Q1 and DEB_OUT are high, the output of the XOR gate 115 will switch to low. This will cause the output of the multiplexer 61 to be equivalent to the output signal DEB_OUT of the circuit and the input to the flip-flop 60 will therefore also be high. Q2 will therefore revert to the high state on the next transition of the fast clock CLK signal. Therefore even if the transition of Q1 back to the high state is only transient, Q2 will already have been returned to the high state and will only go low again when the next pulse on the TICK signal arrives (assuming Q1 then remains low). Thus, the debounce functionality on the transition from the high to low state is also provided.

The circuit of FIG. 11 provides the debounce function on transitions in both directions. However it does require the additional two XOR gates 115, 116 and the additional NOR gate 156. FIG. 8 provided a modification of a circuit of FIG. 5 which avoided the need for the AND gate. The circuit of FIG. 12 again provides modification of the circuit of FIG. 11 which provides for debouncing during transitions in both directions whilst avoiding the need for the AND gate 155, the NOR gate 156, the OR gate 157, the flip-flop 160, and one of the XOR gates 115, 116.

Figure 12:
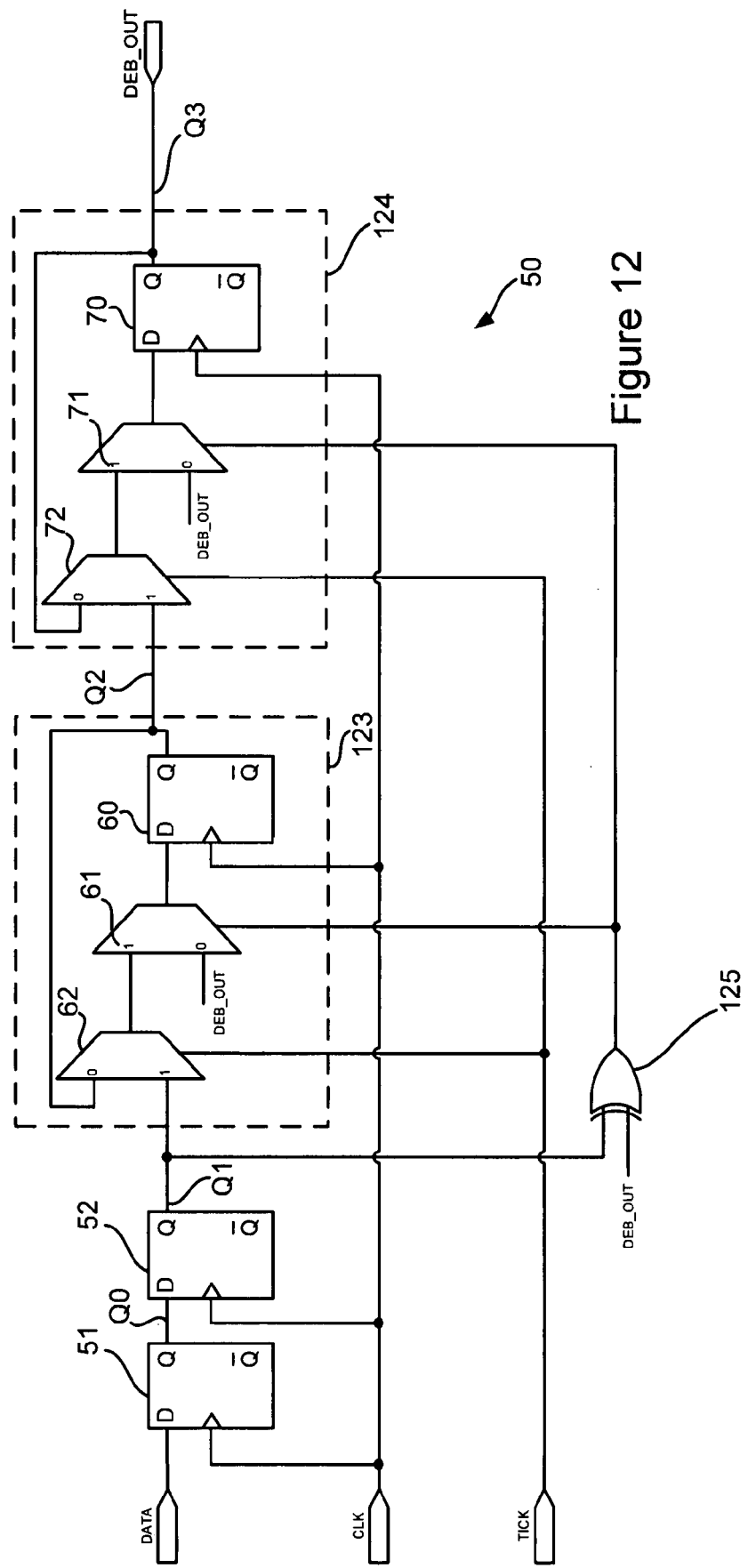
FIG. 12 shows a simplified arrangement for debouncing an input signal transitioning in either direction between high and low states.

The circuit of FIG. 12 is similar to FIG. 8 in that the delay units 123 and 124 are connected in series with the output of one being provided as the input to the next. The multiplexers 61 and 71 of the delay units 123 and 124 are connected to a common control signal provided from the XOR gate 125. This XOR gate is provided with two inputs corresponding to the signal Q1 and the output of a circuit DEB_OUT. Again the 0-inputs of the multiplexers 61 and 71 are provided with the output from the circuit DEB_OUT.

The operation of the circuit of FIG. 12 will now be described in more detail. With the input and the signals Q1, Q2 and Q3 initially in the low state, the output DEB_OUT (which is equivalent to the signal Q3) are all low. When the input (DATA) switches to the high state, the synchronizer (51, 52) provides an output Q1 which switches to high after two transitions of the CLK signal. This causes the output from the XOR gate 125 to switch to the high state causing the multiplexers 61 and 71 to provide as their output the signal from the multiplexers 62 and 72 respectively. Whilst the TICK signal remains low, the multiplexers 62 and 72 simply feed back the output from each of the delay units, maintaining their initial low states.

However, on the next pulse on the TICK signal, the multiplexers 62 and 72 switch to providing the signal on their 1-inputs. This therefore means that Q2 switches to the state provided by Q1 and Q3 switches to the previous state of Q2. Thus as Q1 was high, the signal Q2 switches to high. On the next pulse on the TICK signal, the signal Q3 becomes equal to the signal Q2 and so switches to the high state. Consequently, the output DEB_OUT switches to high. This causes the output of the XOR gate 125 to switch to low, since Q1 is already high, which in turn causes the multiplexers 61 and 71 to provide an output corresponding to their 0-input, which is connected to the output of the circuit DEB_OUT.

The debounce function is still provided. Thus if signal Q1 switches to high, Q2 switches to high on the next pulse on the TICK signal. Prior to the subsequent pulse on the TICK signal and Q3 going high, if Q1 transitions back to the low state, the output of the XOR gate 125 switches to low causing the multiplexers 61 and 71 to switch to providing the signal on their zero-inputs which corresponds to the circuit output DEB_OUT. As this is still in the zero state, the outputs of the multiplexers 61, 71 will therefore be zero, causing the outputs of the delay units 123 and 124 to be zero on the next clock (CLK) transition. In other words, even if Q2 has already been set to the high state, if Q1 reverts to the low state before the output DEB_OUT changes to the high state, Q2 is rapidly returned to the low state. Thus this circuit operates in a similar manner to the previously described circuits.

Once the output DEB_OUT has switched to the high state and each of the signals Q1, Q2 and Q3 are all in the high state then the circuit will remain in that condition until the input switches to low. When this occurs, Q1 will switch to the low state causing the output of the XOR gate 125 to switch to the high state. This will mean that the multiplexers 61 and 71 provide an output corresponding to the signal on their 1-input, which is provided by the respective multiplexers 62 and 72. Whilst the signal on the TICK remains low, the outputs of the respective delay units are fed back as the inputs thereby maintaining their states.

When a pulse arrives on the TICK signal, the multiplexers 62 and 72 switch to providing the respective input into the delay unit to the flip-flops 60 and 70 respectively. If Q1 has transitioned back to zero then the output Q2 will revert to zero on the next pulse on the TICK signal. Similarly on the subsequent pulse on the TICK signal, Q3 will revert to zero since Q2, the input to delay unit 124, has reverted to zero.

If, prior to Q3 and DEB_OUT reverting to a low state, Q1 reverts to zero causing Q2 to revert to zero but Q1 then transiently returns to the high state due to bouncing of the input signal (DATA) then, as before, the multiplexer 61 switches to providing DEB_OUT on its output from its 0-input. This means the signal Q2 reverts to the high state rapidly, as soon as the next transition of the clock signal CLK occurs. This is because when Q1 switches back to the high state, the output of the XOR gate 125 switches to zero and the multiplexer 61 provides the circuit output signal DEB_OUT as its output, which at this stage would still be in the high state. This means as soon as the next transition on the clock signal CLK arrives, the flip-flop 60 switches to the high state causing Q2 to revert to being high. In the meantime, Q3 remains high and the output DEB_OUT remains high.

Figure 13:
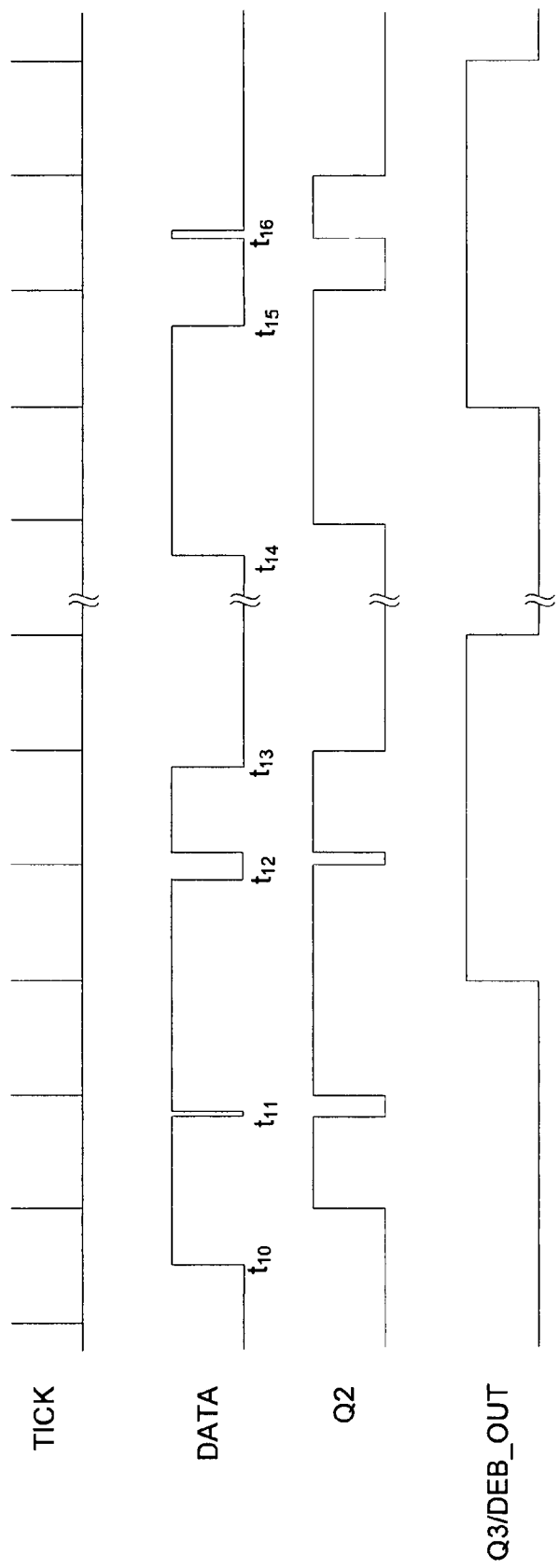
FIG. 13 shows waveforms to assist in explaining the operation of the circuit of FIG. 12.

FIG. 13 shows waveforms to assist in understanding the operation of the arrangement of FIG. 12. At $t_{10}$, the input DATA goes high and the debounce process begins. At the next pulse on the TICK signal, Q2 goes high. However, Q3 remains low and so does the output DEB_OUT. At $t_{11}$, the input has a transient glitch or bounce back to low. As this is long enough to overlap with a fast clock CLK transition, Q1 switches to low causing Q2 to switch to low. At the next TICK pulse, DATA and Q1 are again high and Q2 again becomes high. DATA remains high until the next TICK pulse. As Q2 is already high, the output Q3 switches to high.

Once the output switches to high, any transient transitions of the input will not have the effect of resetting the output on the next fast clock transition. Consequently, when the input goes low at $t_{12}$, Q1 goes low and, at the next TICK pulse, Q2 goes low but Q3 and hence DEB_OUT remain high. In other words, the transient pulse at $t_{12}$ is caught by the debounce function from high to low.

At $t_{13}$, the input again goes low and Q1 follows it. At the next TICK pulse, Q2 goes low and since the input remains low, at the subsequent pulse on the TICK signal, Q3 and the output go low.

At $t_{14}$, the input again goes high and Q2 and Q3 follow, on the following pulses on the TICK signal. At $t_{15}$, the input again goes low and Q1 follows it. However, there is a transient pulse back to high at $t_{16}$ and this is detected by the debounce function. Q2 returns to its high state. Only after the input remains low for two consecutive TICK pulses does the output go low again.

Thus, this arrangement also provides debouncing of an input signal both during its transition from high to low and from low to high. During the debounce period, any glitch or bounce in the input will reset the debounce circuit. However, once the transition is complete, any return of the input to the previous level will not affect the output unless its duration exceeds the debounce period.

As mentioned above, any of the arrangements can be modified to add extra delay units to increase the debounce period. Of course, the period of the TICK signal can be adjusted either alone or in combination to control the debounce period, if desired. Additional delay units are simply connected in series in the arrangements of FIGS. 8 and 12 with the signal Q1 and the CLK and TICK signals being provided. Instead of using the output of the second delay unit as the debounce output, as shown in the embodiments, the output of the final one of any additional delay units is used.

The arrangements of FIGS. 5, 10 and 11 can be similarly modified by adding them in series after the two delay units shown in the embodiments. Each of their respective outputs are provided to the AND gates and NOR gates (in the case of the FIG. 10 and 11 arrangements). Thus the output of the AND and NOR gates is based on the outputs from each of the delay units as well as the input to the first delay unit.

What is claimed is:

1. A debounce circuit arranged to receive a clock signal of a first frequency and a pulse signal providing periodic pulses at a second lower frequency, said debounce circuit comprising a first switching unit and a second switching unit;
   each switching unit including an input stage having an output, a feedback input and one or more inputs;
   each switching unit further including an output stage having an output and an input;
   the output of the output stage of the first switching unit being coupled to one of said one or more inputs of the input stage of the second switching unit;
   each output stage being clocked by the clock signal;
   the output of each output stage being fed back to said feedback input of the respective input stage;
   the output of each input stage being provided to the input of the respective output stage;
   the output of each input stage being selectively coupleable by said input stage to the respective feedback input, dependent on the state of the pulse signal and a control signal provided as one of said one or more inputs of the respective input stage, to maintain the state of the output of the output stage;
   the output of the input stage also being selectively coupleable by said input stage to one of said one or more inputs of the respective input stage, dependant on the state of the pulse signal and said control signal of the respective input stage, to allow changing of the state of the output of the output stage;
   a debounce circuit input signal being provided as one of the inputs of the input stage of the first switching unit;
   a debounce circuit output signal is provided based on the output of said second switching unit.

2. A debounce circuit according to claim 1 wherein said control signal of said first switching unit is coupled to said debounce circuit input signal, and said control signal of said second switching unit is coupled to said output of said output stage of the first switching unit.

3. A debounce circuit according to claim 2 wherein each said input stage is arranged to selectively set its output to a first state when said control signal is in said first state and set its output to a second state when said control signal is in said second state and said pulse signal is in said second state, otherwise said input stage couples its output to said respective feedback input.

4. A debounce circuit according to claim 3 wherein said debounce circuit output signal is in said second state when said debounce circuit input signal, said output of said output stage of said first switching unit and said output of said output stage of said second switching unit are all in said second state.

5. A debounce circuit according to claim 1 wherein said control signal of each of said switching units is coupled to said debounce circuit input signal.

6. A debounce circuit according to claim 5 wherein:
   each said input stage is arranged to selectively set its output to a first state when said control signal is in said first state;
   said input stage of said first switching unit is arranged to selectively set its output to a second state when said control signal is in said second state and said pulse signal is in said second state; and
   said input stage of said second switching unit is arranged to selectively couple its output to said input connected to the output of the output stage of the first switching unit when said control signal is in said second state and said pulse signal is in said second state, otherwise
   said output of each of said input stages is coupled to said respective feedback input.

7. A debounce circuit according to claim 1 wherein:
   a first input of said one or more inputs of each input stage is coupled to the debounce circuit output,
   a second input of said one or more inputs of the input stage of the first switching unit is coupled to said debounce circuit input signal;
   a second input of said one or more inputs of the input stage of the second switching unit is coupled to said output of said output stage of said first switching unit; and
   said control signal of each switching unit is derived by comparing the debounce circuit output signal and the signal provided to said second input of the input stage of the respective switching unit such that if they are not in the same state, the respective control signal is in the second state.

8. A debounce circuit according to claim 7 wherein:
   each said input stage selectively couples its output to said first input when said control signal is in said first state; and
   each said input stage selectively couples its output to said second input when said control signal is in said second state and said pulse signal is in said second state, otherwise
   said output of each of said input stages is coupled to said respective feedback input.

9. A debounce circuit according to claim 8 wherein said debounce circuit output signal switches to said second state when said debounce circuit input signal, said output of said output stage of said first switching unit and said output of said output stage of said second switching unit are all in said second state.

10. A debounce circuit according to claim 8 wherein said debounce circuit output signal switches from said second state to said first state when said debounce circuit input signal, said output of said output stage of said first switching unit and said output of said output stage of said second switching unit are all in said first state.

11. A debounce circuit according to claim 1 wherein:
a first input of said one or more inputs of each input stage is coupled to the debounce circuit output signal,
a second input of said one or more inputs of the input stage of the first switching unit is coupled to said debounce circuit input signal;
a second input of said one or more inputs of the input stage of the second switching unit is coupled to said output of said output stage of said first switching unit; and
said control signal of each switching unit is derived from said debounce circuit input signal and said debounce circuit output signal such that said control signal is in a second state if said debounce circuit input signal and said debounce circuit output signal are not in the same state.

12. A debounce circuit according to claim 11 wherein:
each said input stage selectively couples its output to said respective first input when said control signal is in said first state; and
each said input stage selectively couples its output to said respective second input when said control signal is in said second state and said pulse signal is in said second state, otherwise
each said input stage couples its output to said respective feedback input.

13. A debounce circuit according to claim 1 further comprising one or more additional second switching units, each additional switching unit being connected to a preceding second switching unit in the same manner as the second switching unit is connected to said first switching unit, and said debounce circuit output signal being based on the output of the output stage of at least the final second switching unit.

14. A debounce circuit according to claim 1 wherein each said output stage is a flip-flop.

15. A debounce circuit according to claim 1 further comprising a synchroniser arranged to synchronise said debounce circuit input signal with said clock signal.

16. A debounce circuit arranged to receive a clock signal of a first frequency and a pulse signal providing periodic pulses at a second lower frequency, said debounce circuit comprising:
a first switching unit and one or more second switching units arranged in series, each switching unit having an input and an output, said output being clocked by said clock signal, and
a comparator having an output arranged to provide an output signal in the second state when each of: the input of the first switching unit; the output of the first switching unit and the output of each of the second switching units is in the second state, wherein:
a debounce circuit input signal is provided to the input of the first switching unit;
the output of first switching unit is coupled to the input of a first one of the second switching units;
the input of any additional second switching units is connected to the output of the preceding second switching unit in the series;
the respective output of each of said first and second switching units will change from a first state to a second state after a pulse on said pulse signal when the respective input of the switching unit is in said second state;
the respective output of each of said first and second switching units will change from said second state to said first state when the respective input of the switching unit changes to said first state; and
a debounce circuit output signal is provided based on the output of said comparator.

17. A debounce circuit according to claim 16 wherein each of said first and said one or more second switching units includes a flip-flop clocked by said clock signal, the flip-flop providing said output of the switching unit such that any change of state of the switching unit output is synchronised with the clock signal.

18. A debounce circuit according to claim 17 wherein each of said switching units further includes a selector for providing an input to said flip-flop, wherein said selector is coupled to said output of the switching unit, said pulse signal and first, second and third selector inputs, the first selector input being in said second state, the second selector input being in said first state, and the third selector input being coupled to said input of the switching unit.

19. A debounce circuit arranged to receive a clock signal of a first frequency and a pulse signal providing periodic pulses at a second lower frequency, said debounce circuit comprising:
a first switching unit having a first input and an output, said output being clocked by said clock signal, and
one or more second switching units arranged in series, each second switching unit having a first input, a second input and an output, said output being clocked by said clock signal,
wherein:
a debounce circuit input signal is provided to the first input of each of the first and one or more second switching units;
the output of the first switching unit is coupled to the second input of a first of the second switching units;
the second input of any additional second switching units is connected to the output of the respective preceding second switching unit;
the output of the first switching unit will change from a first state to a second state after a pulse on said pulse signal when the first input of said first switching unit is in said second state;
the output of a second switching unit will change from said first state to said second state after a pulse on said pulse signal when the first and second input of that second switching unit is in said second state;
the output of the first switching unit output will change from said second state to said first state when said first input changes to said first state,
the output of a said second switching unit will change from said second state to said first state either when said first input changes to said first state or after a pulse on said pulse signal when the second input of that switching unit is in said first state;
a debounce circuit output signal is provided from the output of last in the series of said second switching units.

20. A debounce circuit according to claim 19 wherein each of said first and said one or more second switching units includes a flip-flop clocked by said clock signal, the flip-flop providing said output of the switching unit such that any change of state of the switching unit output is synchronised with the clock signal.

21. A debounce circuit according to claim 20 wherein:
said first switching unit further includes a selector for providing an input to said flip-flop, wherein said selector is coupled to said output of the switching unit, said pulse signal and first, second and third selector inputs, the first selector input being in said second state, the second selector input being in said first state, and the third selector input being coupled to the first input of the first switching unit; and
said one or more second switching units each includes a selector for providing an input to said flip-flop, wherein said selector is coupled to said output of the switching unit, said pulse signal and first, second and third selector inputs, the first selector input being coupled to said second input of said second switching unit, the second selector input being in said first state, and the third selector input being coupled to said first input of said second switching unit.

22. A debounce circuit arranged to receive a clock signal of a first frequency and a pulse signal providing periodic pulses at a second lower frequency, said debounce circuit comprising:
a plurality of switching units arranged in series, each switching unit having a first input, a second input and an output, said output being clocked by said clock signal, the second input of a first of said switching units being coupled to a debounce circuit input and the second inputs of the rest of said switching units are each coupled to the output of the respective preceding switching unit; and
a comparator having an output arranged to provide a debounce circuit output, the debounce circuit output being coupled to the first input of each of the switching units, wherein:
the output of a said switching unit will change from a first state to a second state when the second input signal is in said second state and either said first input is in said second state or after a pulse on said pulse signal when said first input is in said first state;
the output of a said switching unit will change from said second state to said first state when the second input is in said first state and either said first input is in said first state or after a pulse on said pulse signal when said first input is in said second state;
the debounce circuit output from said comparator will change from said first state to said second state when the second input of the first switching unit and all the outputs of all the first and second switching units are in said second state; and
the debounce circuit output from said comparator will change from said second state to said first state when the second input of the first switching unit and all the outputs of the first and second switching units are in said first state.

23. A debounce circuit according to claim 22 wherein each of said switching units includes a flip-flop clocked by said clock signal, the flip-flop providing said output of the switching unit such that any change of state of the switching unit output is synchronised with the clock signal.

24. A debounce circuit according to claim 23 wherein each of said switching units further includes a selector for providing an input to said flip-flop, wherein said selector is coupled to said output of the switching unit, said pulse signal and first, second and third selector inputs, the first selector input being coupled to said second input, the second selector input being coupled to said first input, and the third selector input being coupled to the output of a second comparator.

25. A debounce circuit according to claim 24 wherein said second comparator compares said first input of said switching unit and said second input of said switching unit to provide an output in said first state when said first input and said second input are in the same state.

26. A debounce circuit according to claim 25 wherein said second comparator is an XOR gate.

27. A debounce circuit arranged to receive a clock signal of a first frequency and a pulse signal providing periodic pulses at a second lower frequency, said debounce circuit comprising:
a plurality of switching units arranged in series, each switching unit having a first input, a second input, a third input and an output, said output being clocked by said clock signal, the first input of each of said switching units being coupled to a debounce circuit output, the second input of a first of said switching units being coupled to a debounce circuit input and the second inputs of the rest of said switching units are each coupled to the output of the respective preceding switching unit; and
a comparator for comparing said debounce circuit input to said debounce circuit output to provide an output in said second state when said debounce circuit input and said debounce circuit output are in the same state, the output of said comparator being coupled to the third input of each of said switching units, wherein:
the output of a said switching unit will change from a first state to a second state under any one of the following conditions:
said first input is in said second state and said third input is in said first state,
after a pulse on said pulse signal, said second input and said third input are both in said second state, and
after a pulse on said pulse signal, said first input and said second input are both in said second state;
the output of a said switching unit will change from said second state to said first state under any one of the following conditions:
said first input and said third input are both in said first state, and
after a pulse on said pulse signal, said second input is in said first state and said third input is in said second state; and
a debounce circuit output signal is provided from the output of last in the series of said switching units.

28. A debounce circuit according to claim 27 wherein each of said switching units includes a flip-flop clocked by said clock signal, the flip-flop providing said output of the switching unit such that any change of state of the switching unit output is synchronised with the clock signal.

29. A debounce circuit according to claim 28 wherein each of said switching units further includes a selector for providing an input to said flip-flop, wherein said selector is coupled to said output of the switching unit, said pulse signal and first, second and third selector inputs, the first selector input being coupled to the second input of said switching unit, the second selector input being coupled to the first input of said switching unit, and the third selector input being coupled to the third input of said switching unit.

30. A debounce circuit according to claim 27 wherein said comparator is an XOR gate.

31. A debounce circuit according to claim 18, wherein said selector includes:
a first multiplexer controlled to switch between said input connected to said output of the switching unit and said first selector input, when said pulse signal is in said first state and second state respectively; and a second multiplexer controlled to switch between said second selector input and an input connected to the output of the first multiplexer, when said switching unit input signal is in said first state and second state respectively, wherein said selector output is coupled to said second multiplexer output.

32. A debounce circuit according to claim 16 further comprising a synchroniser which is arranged to synchronise a circuit input signal with said clock signal to provide said input signal.

33. A debounce circuit according to claim 32 wherein said synchroniser includes a flip-flop clocked by said clock signal.

34. A debounce circuit according to claim 32 wherein said synchroniser includes a plurality of flip-flops connected in series with each other and each clocked by said clock signal.

35. A debounce circuit according to claim 1 further comprising a pulse signal generator having a delay means for delaying a second clock signal by one period of said clock signal and providing an output pulse when said delayed second clock signal is in said first state and said second clock signal is in said second state.

36. A debounce circuit according to claim 35 wherein said delay means is a flip-flop.

37. A debounce circuit according to claim 35 further comprising a second synchroniser for synchronising the transitions of said second clock signal with said clock signal.

38. A debounce circuit for delaying a change of state of an output until the state of an input has been unchanged for a minimum period after an initial change, the circuit comprising:

a delay section comprising a plurality of delay units arranged sequentially, the output from each delay unit other than the final delay unit is passed as an input to a subsequent delay unit; the output from the final delay unit is provided as an output of the delay section; and the input to the debounce circuit is coupled to the input of a first of the delay units, wherein each delay unit is arranged to delay the change of state of its output from a first state to a second state after a change of state of an input from a first state to a second state until a transition on a first timing signal occurs, and each delay unit is arranged to revert to the first state if the input reverts to the first state once a transition on a second timing signal is received, the second timing signal having a shorter period than the first timing signal.

39. A debounce circuit for delaying a change of state of an output until the state of an input has been unchanged for a minimum period after an initial change, the circuit comprising:

a delay section comprising a plurality of delay units arranged sequentially, the output from each delay unit other than the final delay unit is passed as an input to a subsequent delay unit; the output from the final delay unit is provided as an output of the delay section; and the input to the debounce circuit is coupled to the input of a first of the delay units, wherein when said debounce circuit output is in a first state:

each delay unit is arranged to delay the change of state of its output from said first state to a second state after a change of state of an input from said first state to said second state until a transition on a first timing signal occurs; and each delay unit is arranged to revert to the first state if the input reverts to the first state once a transition on a second timing signal is received, the second timing signal having a shorter period than the first timing signal, and when said debounce circuit output is in a second state:

each delay unit is arranged to delay the change of state of its output from said second state to said first state after a change of state of an input from said second state to said first state until a transition on said first timing signal occurs; and each delay unit is arranged to revert to the second state if the input reverts to the second state once a transition on said second timing signal is received.

40. A debounce circuit for delaying a change of state of its output until the state of an input has been unchanged for a period after an initial change, the circuit comprising:

a delay section comprising a plurality of delay units arranged sequentially, the output from each delay unit other than the final delay unit is passed as an input to a subsequent delay unit and the input to the debounce circuit is coupled to the input of a first of the delay units, wherein each delay unit is arranged to delay the change of state of its output after a change of state of an input until a transition on a timing signal is received;

a first comparator for determining if the debounce circuit input and the output from all of the delay units are in a second state; and a second comparator for determining if the debounce circuit input and the output from all of the delay units are in a first state;

an output stage arranged to switch said debounce circuit output from a first state to a second state when said first comparator determines that all of the delay unit outputs are in a said second state, and to switch said debounce circuit output from a second state to a first state when said second comparator determines that all of the delay unit outputs are in a said first state.

41. A debounce circuit according to claim 1 wherein said first state is logic high and said second state is logic low.

42. A system comprising a debounce circuit according to claim 1.

43. A portable electronic device comprising a debounce circuit according to claim 1.

44. An electronic apparatus comprising a debounce circuit according to claim 1.

45. An electronic apparatus according to claim 44 wherein the electronic apparatus is one selected from the group comprising: an audio player; a portable computing unit; a mobile communications unit; a satellite navigation unit; a still camera and a video camera.

46. A vehicle including a debounce circuit according to claim 1.

47. A method of debouncing a debounce input signal to provide a debounce output signal, the method comprising:

a first delay step to produce a first delayed signal; and a second delay step arranged to receive said first delayed signal to provide a second delayed signal, wherein said first delay step comprises:

a first stage arranged to output a first stage output signal, the first stage output signal being selected from said first delayed signal and one of one or more first stage input signals, dependent on the state of a pulse signal and a control signal provided as one of said one or more first stage input signals; and a second stage arranged to receive and delay said first stage output signal according to a clock signal to provide said first delayed signal, said second delay step comprises:
a third stage arranged to output a third stage output signal, the third stage output signal being selected from said second delayed signal and one of one or more third stage input signals, dependent on the state of said pulse signal and a control signal provided as one of said one or more third stage input signals; and
a fourth stage arranged to receive and delay said third stage output signal according to said clock signal to provide said second delayed signal,
wherein
the debounce input signal is provided as one of said one of one or more first stage input signals;
said debounce output signal is provided based on said second delayed signal; and
the pulse signal has a first period greater than the period of said clock signal.

48. A method according to claim 47 wherein said control signal of said first stage is said debounce input signal and said control signal of said second step is said first delayed signal.

49. A method according to claim 48 wherein:
said first stage output signal is in a first state when said respective control signal is in said first state, and in a second state when said respective control signal is in said second state and said pulse signal is in said second state; and
said third stage output signal is in a first state when said respective control signal is in said first state, and in a second state when said respective control signal is in said second state and said pulse signal is in said second state, otherwise said third stage output signal is provided from said second delayed signal.

50. A method according to claim 49 wherein said debounce output signal is in said second state when said debounce input signal, said first delayed signal and said second delayed signal are all in said second state.

51. A method according to claim 47 wherein said control signal of each of first and third stages is provided from said debounce input signal.

52. A method according to claim 51 wherein:
said first stage output signal is in a first state when said respective control signal is in said first state, and in a second state when said respective control signal is in said second state and said pulse signal is in said second state, otherwise said first stage output signal is provided from said first delayed signal; and
said third stage output signal is in a first state when said respective control signal is in said first state, and said third stage output signal is provided from said first delayed signal when said control signal is in said second state and said pulse signal is in said second state, otherwise said third stage output is provided from said second delayed signal.

53. A method according to claim 47 wherein:
a first input of said one or more first stage input signals is provided from the debounce output signal,
a second input of said one or more first stage input signals is provided from said debounce input signal;
a first input of said one or more third stage input signals is provided from the debounce output signal,
a second input of said one or more third stage input signals is provided from said first delayed signal;
said control signal of said first delay step is derived by comparing the debounce output signal and the debounce input signal such that if they are not in the same state, the first delay step control signal is in the second state; and
said control signal of said third delay step is derived by comparing the debounce output signal and the signal provided to said second input of the third stage such that if they are not in the same state, the third delay step control signal is in the second state.

54. A method according to claim 53 wherein:
said first stage output signal is provided from said first input of said first stage when said control signal is in said first state, the first stage output signal is provided from said second input of said first stage when said control signal is in said second state and said pulse signal is in said second state, otherwise said first stage output signal is provided from the first delayed signal; and
said third stage output signal is provided from said first input of said third stage when said control signal is in said first state, the third stage output signal is provided from said second input of said third stage when said respective control signal is in said second state and said pulse signal is in said second state, otherwise said third stage output signal is provided from the second delayed signal.

55. A method according to claim 54 wherein said debounce output signal switches to said second state when said debounce input signal, said first delayed signal and said second delayed signal are all in said second state.

56. A method according to claim 54 wherein said debounce output signal switches from said second state to said first state when said debounce input signal, said first delayed signal and said second delayed signal are all in said first state.

57. A method according to claim 47 wherein:
a first input of said one or more first stage input signals is provided from the debounce output signal,
a second input of said one or more first stage input signals is provided from said debounce input signal;
a first input of said one or more third stage input signals is provided from the debounce output signal,
a second input of said one or more third stage input signals is provided from said first delayed signal; and
said control signals of said first and third delay steps are derived by comparing the debounce output signal and the debounce input signal such that if they are not in the same state, the first and third delay step control signals are in the second state.

58. A method according to claim 57 wherein:
said first stage output signal is provided from said first input of said first stage when said control signal is in said first state, the first stage output signal is provided from said second input of said first stage when said control signal is in said second state and said pulse signal is in said second state, otherwise said first stage output signal is provided from the first delayed signal; and
said third stage output signal is provided from said first input of said third stage when said control signal is in said first state, the third stage output signal is provided from said second input of said first stage when said control signal is in said second state and said pulse signal is in said second state, otherwise said third stage output signal is provided from the second delayed signal.

59. A method of debouncing an input signal according to claim 47 wherein said first state is logic high and said second state is logic low.

* * * * *